US008259765B2

(12) United States Patent
Rossi et al.

(10) Patent No.: US 8,259,765 B2
(45) Date of Patent: Sep. 4, 2012

(54) PASSIVE PHASE CONTROL IN AN EXTERNAL CAVITY LASER

(75) Inventors: Giacomo Antonio Rossi, Milan (IT); Marco De Donno, Milan (IT); Paolo Zago, Milan (IT)

(73) Assignee: Google Inc., Mountain View, CA (US)

( * ) Notice: Subject to any disclaimer, the term of this patent is extended or adjusted under 35 U.S.C. 154(b) by 650 days.

(21) Appl. No.: 12/084,318

(22) PCT Filed: Dec. 6, 2005

(86) PCT No.: PCT/EP2005/013060
§ 371 (c)(1),
(2), (4) Date: Apr. 30, 2008

(87) PCT Pub. No.: WO2007/065455
PCT Pub. Date: Jun. 14, 2007

(65) Prior Publication Data
US 2010/0177793 A1    Jul. 15, 2010

(51) Int. Cl.
*H01S 3/04* (2006.01)
(52) U.S. Cl. ............................ 372/34; 372/20
(58) Field of Classification Search ............ 372/36, 372/35, 34
See application file for complete search history.

(56) References Cited

U.S. PATENT DOCUMENTS

| | | | |
|---|---|---|---|
| 4,442,450 A | | 4/1984 | Lipschutz et al. |
| 4,479,140 A | | 10/1984 | Horvath |
| 5,005,178 A | * | 4/1991 | Kluitmans et al. ............ 372/36 |
| 5,223,741 A | * | 6/1993 | Bechtel et al. ............ 257/678 |

(Continued)

FOREIGN PATENT DOCUMENTS

EP    0 899 795 A2    3/1999
(Continued)

OTHER PUBLICATIONS

De Merlier, J. et al., "Full C-Band External Cavity Wavelegnth Tunable Laser Using a Liquid-Crystal-Based Tunable Mirror," IEEE Photonics Technology Letters, vol. 17, No. 3, pp. 681-683, (2005).

(Continued)

*Primary Examiner* — Jessica Stultz
*Assistant Examiner* — Tuan Nguyen
(74) *Attorney, Agent, or Firm* — Honigman Miller Schwartz and Cohn LLP

(57) ABSTRACT

An external-cavity laser module includes a package defining an enclosure, the package including a base having a surface internal to the enclosure, a thermoelectric cooler within the enclosure, the thermoelectric cooler including an upper carrier plate and a lower carrier plate, the lower carrier plate being placed on the internal surface of the base and the thermoelectric cooler (TEC) being configured to stabilize the temperature of the upper carrier plate at a substantially constant temperature. The laser module further includes a laser assembly housed within the enclosure, including a gain medium for emitting an optical beam into the external cavity and an end mirror. Variations of the environmental temperature with respect to the thermally stabilized temperature cause mechanical deformations of the TEC upper carrier plate that is in thermal coupling with the laser assembly. The mechanical deformations in turn induce variations in the optical path length of the laser cavity. Thermal bridge of the gain medium to the environmental temperature is achieved by the use of a thermal bridge element for conducting heat either from or to the gain medium.

31 Claims, 11 Drawing Sheets

U.S. PATENT DOCUMENTS

| | | | |
|---|---|---|---|
| 5,376,587 A | 12/1994 | Buchmann et al. | |
| 5,703,893 A * | 12/1997 | Komiyama et al. | 372/43.01 |
| 5,767,579 A * | 6/1998 | Kanazawa et al. | 257/717 |
| 6,181,718 B1 * | 1/2001 | Kobayashi et al. | 372/34 |
| 6,345,059 B1 | 2/2002 | Flanders | |
| 6,526,071 B1 | 2/2003 | Zorabedian et al. | |
| 6,658,031 B2 | 12/2003 | Tuganov et al. | |
| 6,663,294 B2 * | 12/2003 | Crane et al. | 385/92 |
| 6,665,321 B1 * | 12/2003 | Sochava et al. | 372/20 |
| 6,724,797 B2 | 4/2004 | Daiber | |
| 6,763,047 B2 | 7/2004 | Daiber et al. | |
| 6,898,222 B2 * | 5/2005 | Hennig et al. | 372/36 |
| 7,295,582 B2 * | 11/2007 | McDonald et al. | 372/20 |
| 2002/0181526 A1 | 12/2002 | Gao | |
| 2003/0007523 A1 | 1/2003 | Chapman et al. | |
| 2003/0007539 A1 | 1/2003 | Sell et al. | |
| 2003/0016709 A1 | 1/2003 | Flanders | |

FOREIGN PATENT DOCUMENTS

| | | |
|---|---|---|
| EP | 1 130 717 A2 | 9/2001 |
| EP | 1 130 717 A3 | 9/2001 |
| WO | WO 2005/041371 A1 | 5/2005 |
| WO | WO 2005/064365 A1 | 7/2005 |

OTHER PUBLICATIONS

European Patent Office Action dated May 26, 2010 for European Patent Application No. 05814644.0.

Lee, Chin C. et al, "The Effect of Bonding Wires on Longitudinal Temperature Profiles of Laser Diodes," J. of Lightwave Tech., IEEE Service Center, New York, NY, US, vol. 14, n. 8, Aug. 1, 1996, XP011028621ISSN:0733-8724, pp. 1847-1852.

* cited by examiner

//PASSIVE PHASE CONTROL IN AN EXTERNAL CAVITY LASER

PASSIVE PHASE CONTROL IN AN EXTERNAL CAVITY LASER

CROSS REFERENCE TO RELATED APPLICATION

This application is a national phase application based on PCT/EP2005/013060, filed Dec. 6, 2005, the content of which is incorporated herein by reference.

BACKGROUND OF THE INVENTION

1. Field of the Invention

The invention relates to an external-cavity laser and in particular to an external cavity tuneable laser that is especially adapted as optical transmitter for wavelength-division multiplexed optical communication networks.

2. Description of the Related Art

The use of lasers as tuneable light source can greatly improve the reconfigurability of wavelength-division multiplexed (WDM) systems or of the newly evolved dense WDM (DWDM) systems. For example, different channels can be assigned to a node by simply tuning the wavelength. Also, tuneable lasers can be used to form virtual private networks based on wavelength routing, i.e., photonic networks.

Different approaches can be used to provide tuneable lasers, such as distributed Bragg reflector lasers, VCSEL lasers with a mobile top mirror, or external-cavity diode lasers. External-cavity tuneable lasers offer several advantages, such as high output power, wide tuning range, good side mode suppression and narrow linewidth. Various laser tuning mechanisms have been developed to provide external-cavity wavelength selection, such as mechanically adjustable or electrically activated channel selector elements.

U.S. Pat. No. 6,526,071 describes an external-cavity tuneable laser that can be employed in telecom applications to generate the centre wavelengths for any channel on the International Telecommunications Union (ITU) grid. The disclosed tuneable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels. The grid generator is dimensioned to have a free spectral range (FSR) corresponding to the spacing between gridlines of a selected wavelength grid (an ITU grid) and the channel selector is dimensioned to have a FSR broader than that of the grid generator which is itself broader than the FSR of the cavity.

Typically, the grid generator is a Fabry-Perot etalon defining a plurality of transmission peaks (also referred to as passbands) defining periodic longitudinal modes. To select a periodic longitudinal mode (i.e., a lasing channel on the ITU grid), several channel selecting mechanisms have been considered, including rotating a diffraction grating, mechanically translating a wedge-shaped etalon, or varying the voltage or current supplied to an electro-optically controlled element.

J. De Merlier et al. in "*Full C-Band External Cavity Wavelength Tuneable Laser Using a Liquid-Crystal-Based Tuneable Mirror*", published in IEEE Photonics technology Letters, vol. 17, No. 3 (2005), pages 681-683, disclose an external cavity tuneable laser containing a fixed etalon with a FSR of 50 GHz and a liquid crystal (LC) based tuneable mirror. The tuneable mirror is an optical resonator that works in reflection, exhibiting one reflection peak over a wide wavelength range which can be tuned over the whole C-band by adjusting the amplitude of the ac voltage signal. The laser consists of a chip containing a gain and a phase section. The integration of the phase control on the chip avoids the need for mechanical tuning of the cavity length.

An external cavity tuneable laser with an etalon as grid generator and an LC-based tuneable mirror is described in WO patent application No. 2005/041371.

In order to accommodate increasing optical communication traffic, DWDM systems with channel spacing of 50 GHz and even of 25 GHz have been recently developed. As DWDM uses narrower channel spacing, wavelength (frequency) accuracy of transmitter lasers over the entire tuning (e.g., the C-band) and operating temperature range has become an important issue. DWDM systems with 50 GHz channel spacing typically require an accuracy of ±2.5 GHz about the lasing frequency, whereas systems with 25 GHz generally require a frequency accuracy of ±1.25 GHz.

As tuneable elements are configured for narrower channel separation, decreasing component tolerances and thermal fluctuations become increasingly important. Spatial misalignments of optical components of the laser device may arise from temperature variations due to expansions and contractions associated to the various components, which will reduce wavelength stability and generally reduce the performance of the laser. The laser response needs to be stabilised across a relatively wide temperature range, typically ranging from −5° C. to 70° C. To ensure thermal stability, many telecommunication laser devices are mounted on a common platform, which exhibits high thermal conductivity and is subject to the thermal control of one or more thermo-electric coolers (TECs). Temperature control allows for maintenance of thermal alignment of the optical components.

In an external cavity laser, a resonant external cavity is formed with optical path length $L_{opt}$ between a first mirror, typically the reflective rear surface of the gain medium, and a second mirror, the end mirror. The free spectral range (FSR) of the laser cavity, i.e., the spacing between the cavity modes, depends on the optical path length, owing to the relation $$(FSR) = \frac{c_0}{2L_{opt}} \quad (1)$$

wherein $c_0$ is the speed of light in vacuo.

The optical path length of an external cavity laser is a sum of the products of indices of refraction and optical thicknesses of the various elements or components present in the optical path across the external cavity, including the air present within the cavity. Thus, the optical path length of the laser cavity can be shown as $$L_{opt} = \Sigma_i n_i L_i \quad (2)$$

where $n_i$ (i=1, ..., m) is the refractive index of the medium filling the $i^{th}$-optical element (component) that the light encounters in the cavity and of the cavity itself (i.e., the free space, $n_{FS} \approx 1$), while $L_i$ is the thickness of the $i^{th}$-element and the physical length the light travels in free space (i.e., the free-space physical length). The external cavity can be thought of as an optical resonator composed of two confronting and reflective, generally parallel, surfaces separated by a length, which is defined as the physical length of the cavity, $L_0$. In general, $L_{opt} \geq L_0$.

U.S. Pat. No. 6,658,031 discloses a laser apparatus that uses an active thermal adjustment of a laser cavity reflective element to minimise losses and provide wavelength stability. A compensating member is coupled to a reflector and configured to thermally position the one reflector with respect to the other reflector in order to maintain an optical path length that does not vary with temperature (except during active thermal control of the compensating member). The thermal positioning may be carried out by a thermoelectric controller operatively coupled to the compensating member and configured to thermally adjust the compensating member by heating or cooling thereof.

In U.S. Pat. No. 6,724,797, an external-cavity laser device is disclosed, wherein selective thermal control is applied to optical components having a high susceptibility to thermal misalignments. The gain medium and the optical output assembly, which are temperature sensitive components, are mounted on a thermally conductive substrate. A TEC is coupled to the substrate to allow for the gain medium and the output assembly to be thermally controlled independently from the end mirror and other components of the external cavity laser. Components of the external cavity, which are thermally isolated from the thermally conductive substrate, may comprise a channel selector and a tuning assembly.

From Eq. (2) it can be seen that $L_{opt}$ may be adjusted by physical adjustment of the spacing between the two end mirrors defining the external cavity and/or by adjusting the refractive index of the material present in the external cavity. Semiconductor gain media such as InGaAs and InGaAsP have generally high refraction indices that exhibit relatively large variations with temperature and therefore can significantly contribute to the overall external cavity optical path length.

U.S. Pat. No. 6,763,047 describes an external cavity laser apparatus that uses an active thermal adjustment of the external cavity to minimise losses and provide wavelength stability. The apparatus of the cited patent includes a thermally conductive platform, a gain medium and an end mirror thermally coupled to the platform and a thermoelectric controller thermally coupled to the platform and configured to cause the platform to expand and contract in response to a temperature change of the platform, thereby adjusting the optical path length of the cavity. Heating or cooling of the platform by the thermoelectric controller provides temperature control of the gain medium refractive index via thermal conduction with gain medium and/or thermal expansion or contraction of the platform to control the spacing between the end mirrors. A control element is operatively coupled to the thermoelectric controller to provide control instructions regarding heating or cooling of the platform, and hence of the gain medium.

In the field of integrated circuits, different techniques and structures have been proposed to remove the heat generated by the operation of semiconductor devices in order to maintain the temperature of the devices within a predetermined range.

U.S. Pat. No. 4,442,450 describes an electronic semiconductor package having a support substrate, an integrated circuit semiconductor device mounted on said substrate, a cover mounted on said substrate disposed over said device and thermal bridge for conducting heat from said device to said cover. The thermal bridge comprises a relatively thick metal sheet provided with grooves and cuts that make the thermal bridge bendable, said metal sheet being overlaid by a spring element to selectively urge part of the bridge into contact with the device.

In U.S. Pat. No. 4,479,140, a thermal bridge element is used in a semiconductor package to conduct heat from a semiconductor device mounted on a substrate to a cold plate or cap in close proximity to the device.

SUMMARY OF THE INVENTION

The present invention relates to an external cavity laser assembly comprising a gain medium, which is in thermal coupling to a thermoelectric cooler (TEC). The laser assembly preferably comprises an end mirror, which is preferably in thermal coupling to a thermoelectric cooler.

The gain medium is preferably a semiconductor gain medium, such as a semiconductor laser chip. Due to environmental thermal fluctuations and to heating generated during operation, semiconductor gain media undergo thermal fluctuations that in turn induce variations of the refractive index with consequent changes of the optical path length of the laser external cavity. In order to improve temperature stability, the gain medium is thermally coupled to a thermoelectric cooler (TEC) that provides the gain medium with thermal control. The TEC comprises a surface in thermal coupling with the gain medium so that excessive heating of the gain medium can be dissipated through the TEC, which is operatively arranged so as to maintain said TEC surface at a substantially constant temperature. Within this context, a substantially constant temperature refers to a temperature stabilised within a narrow range with respect to its mean value, e.g., 25° C.±0.2° C. or 22° C.±0.5° C. As it will become clearer from the following discussion, thermal coupling between the gain medium and the TEC means that a heat flow path with a defined thermal resistance exists between the gain medium and the TEC thermally stabilised surface.

The TEC which the gain medium is thermally coupled to includes preferably a Peltier cell. A Peltier cell is a well known semiconductor junction device that can produce heat or cold on one of it surfaces depending on the direction of the current applied to it and independently of the environmental temperature. The change of temperature is achieved by the use of the well-known Peltier effect, in which a lower temperature is created on one side of a semiconductor junction array or layer, and an elevated temperature on the opposite side. This essentially leads to a transfer of heat to or from a first surface from or to an underlying substrate or structure. The temperature of the first surface can thereby be changed, either increased or decreased, by a current applied to the device, in the appropriate direction. To increase the effect, it is necessary to increase the current density. Thus, by the mere exertion of an electrical current, the temperature of the first surface can adaptively be adjusted and changed. This effect is reversible. If the direction of current is changed, the original cooling side will become the heating side and the heating side becomes the cooling side.

The TEC including a Peltier cell can have a standard construction comprising two ceramic carrier plates with a series of P- and N-doped semiconductor materials (i.e., the Peltier cell), typically consisting of several hundred PN couples of bismuth-telluride semiconductor material, sandwiched between them. Typically, the two carrier plates are of thermally conductive ceramic, such as AlN or $Al_2O_3$.

For thermal stabilisation, operation of the Peltier cell is set so that the temperature of one of its sides, i.e., its first surface, is maintained at the same temperature within a given narrow temperature range, e.g., 25° C.±0.1° C. Considering a typical construction of a TEC including a Peltier cell, this means that one of the TEC carrier plates is thermally stabilised, said carrier plate including a surface, hereafter referred to as the thermal interface or the thermally stabilised surface, which the gain medium of the external cavity laser, and preferably also the other optical components within the laser cavity, is in thermal coupling to. The TEC carrier plate maintained at a substantially constant temperature will be referred to as the "upper" carrier plate with respect to the Peltier cell, whereas the carrier plate at about the environmental temperature will be referred to as the "lower" plate, reflecting a typical orientation of a thermally controlled cavity laser.

In one of its aspects, the present invention relates to an external cavity laser module comprising a package defining an enclosure and including a base and a laser assembly placed within the enclosure, said laser assembly comprising a gain medium placed in thermal coupling to the thermally stabilised surface of a TEC.

According to a preferred embodiment, the laser assembly comprising the gain medium and the end mirror is placed on a common thermally conductive platform, i.e., an optical bench, which is in thermal contact with the thermally stabilised surface of a TEC.

Applicant has observed that environmental temperature variations may induce mechanical deformations of the thermally stabilised surface of the TEC, i.e., of the thermally stabilised TEC carrier plate. Said deformations are due to a temperature difference between the surface maintained at a substantially constant temperature and the lower surface underlying the semiconductor array (i.e., the lower carrier plate), which is at the environmental temperature. Depending also on the thermal expansion coefficient of the material making the two carrier plates of the TEC, the bigger the difference between the substantially constant temperature and the environmental temperature, the larger the mechanical deformation.

In the preferred embodiments of the present invention, the gain medium is placed on a thermally conductive platform, which is in thermal contact with the thermally stabilised surface of the TEC, e.g., bonded to the TEC upper carrier plate. In case of a thermally conductive platform mounting the gain medium (either directly or through a submount), mechanical deformations of the thermally-stabilised carrier plate can be transmitted to the thermally conductive platform. The magnitude of the transmitted compressive or tensile strain depends on the Young's modulus and on the thickness of the thermally conductive platform. A highly rigid platform (e.g., a CVD-diamond base plate with Young's modulus of about 1050 GPa or a SiC base plate with Young's modulus of about 470 GPa) would not be significantly affected by deformations in the underlying layers. Similarly, a thermally conductive platform having a large thickness, e.g., larger than about 1.5 mm, would to a large extent dampen down the deformations occurring in the underlying carrier plate. However, thermally conductive platforms suitable as optical benches for laser assemblies made of a material having very large Young's modulus, e.g., CVD-diamond or SiC, are also very expensive. On the other hand, optical benches having relatively large thickness often do not match the package constraints.

Mechanical deformations of the TEC thermal interface (or of the thermally conductive platform on the TEC) in turn induce variations in the optical path length of the laser cavity, mostly due to variations of the free-space physical length. For instance, a variation of the environmental temperature from 25° C. to 70° C. may lead to a reduction of the optical path length from a few tenths of micron to more than 2 μm, depending on several factors, such as the surface area of the TEC upper carrier plate and the thickness of the thermally conductive platform.

In external-cavity tuneable lasers for WDM systems, variations of the cavity optical path length cause an offset of the cavity mode from the centre of the (selected) etalon peak. Such an optical misalignment of the cavity modes introduces optical losses that lead to a drop in the output power at the selected lasing channel, which can be unacceptable when a stable output at selectable wavelengths during laser operation is required. The optical misalignment involves also a frequency shift of the output frequency (i.e., the lasing wavelength), such a shift ranging for instance from 100 MHz to 1 GHz.

Although a possible solution resides in using an electronically controlled component coupled to an optical element of the laser cavity (e.g., a piezoelectric actuator that adjust the position of the end mirror), in order compensate for the optical path length changes, active adjustments would introduce complexity in the laser package, thereby increasing the manufacturing costs.

Centering of the lasing channel could be attained by monitoring the laser output power and by making adjustments of the injection current of the gain medium, until the power is maximised. However, the Applicant has observed that when deformations of the TEC upper plate are more pronounced because of a relatively large temperature gradient between the stabilised temperature and the environmental temperature (e.g., more than 20° C.; within the operative temperature range, gradients can be up to 45-50° C.), the adjustments of the injection current necessary to compensate the optical effect of the deformations are relatively large, e.g., up to about 60-70 mA. It follows that the variations of the optical power needed to restore the alignment condition are significant and can adversely affect the stability of the laser output by introducing relatively large fluctuations, e.g., of 1 dB, in the output optical power.

The Applicant has therefore understood the need of reducing the effect of mechanical deformations so that adjustments of the injection current of the gain medium are either unnecessary or at least can occur within a narrow range of values, preferably within about 10 mA and more preferably within 5 mA. In this way, the stability of the lasing signal is not adversely affected.

FIG. 1 schematically illustrates a typical configuration of a thermally controlled external cavity laser. The external cavity laser 1 includes a semiconductor gain chip 2 as gain medium emitting a light beam and an end mirror 3, the gain medium and preferably the end mirror being thermally coupled to a thermoelectric cooler 4. The gain medium 2 is placed on a thermally conductive submount 9, which is placed on a thermally conductive platform or optical bench 10. The end mirror 3 is also placed on the optical bench 10. The thermoelectric cooler (TEC) 4 includes a Peltier cell 7, an upper carrier plate 5 including a thermal interface 6, the temperature of said thermal interface being maintained at a given temperature, $T_1$, and a lower carrier plate 8 placed at the environmental temperature, $T_{env}$. "Upper" and "lower" plates, 5 and 8, with respect to the Peltier cell 7 are referred to a typical orientation of a thermally controlled cavity laser, i.e., the one shown in FIG. 1. The optical bench 10 is in thermal contact with the thermal interface 6 of the TEC 4, e.g., it is bonded to the upper carrier plate 5, so as to ensure a negligible thermal resistance between them. The surface area of the thermal interface 6 is such that the laser cavity is placed directly above the thermally stabilised upper carrier plate 5, i.e., both the gain medium 2 and the end mirror 3 are mounted on the surface area of the optical bench 10 placed above the upper carrier plate. In other words, the gain chip and the end mirror are placed at zero distance from the upper carrier plate 5 along the main longitudinal direction of the upper carrier plate, which is typically, but not necessarily, substantially parallel to the main optical axis of the optical beam within the laser cavity. Assuming that both the optical bench and the submount have a thermal conductivity not smaller than about 120 W/mK (such as in case of typical thermally conductive materials employed in laser assemblies, for instance AlN or SiC), the end mirror is thermally stabilised at substantially $T_1$ (e.g., $T_1 \pm 0.1°$ C.), while the temperature of the gain medium can slightly differ from $T_1$, for example of about +1° C., due to heating of the semiconductor chip during operation.

In the case depicted in FIG. 1, mechanical deformations caused by the temperature difference, $\Delta T=(T_{env}-T_1)$, induce an increase or decrease (depending on the sign of $\Delta T$) of the optical path length, $L_{opt}$.

The Applicant has noticed that the magnitude of the mechanical deformations increases with increasing the surface area of the upper carrier plate, and thus of the thermal interface, of the TEC. Deformations along the longitudinal direction of the main optical axis of the optical beam within the laser cavity (i.e., the longitudinal direction crossing the gain medium and the end mirror) affect the optical path length of the laser cavity. Starting from that observation, the Applicant has considered a TEC of reduced surface dimensions. FIG. 2 illustrates the case of a TEC 4' having an upper carrier plate 5' and a lower carrier plate 8'. A Peltier cell 7' is sandwiched between the upper and the lower carrier plate. The upper carrier plate 5' has a length significantly smaller than that of the optical bench 10 mounting the laser assembly so that both the gain chip and the end mirror are not placed directly above the TEC upper carrier plate 5'. For instance, the surface area of the TEC thermal interface 6' is less than 50% smaller than the surface area of the optical bench, although that value depends on several factors, such as the rigidity of the optical bench. The same reference numerals are given to elements of the laser module corresponding to those shown in FIG. 1 and their description is omitted.

A laser cavity in thermal contact with a TEC having a thermally stabilised surface much smaller than the area occupied by the laser cavity is largely unaffected by mechanical deformations. However, the use of a TEC with a thermally stabilised surface area much smaller than the area occupied by the laser cavity can come at the cost of a reduced thermal stability. Thermal instability caused by the heat generated during operation of the gain medium and in general by a larger sensitivity of the optical components to external thermal fluctuations leads to an instability of the phase of the laser cavity and thus of the lasing frequency.

The Applicant has understood that the effect of mechanical deformations, i.e., the variation in the optical path length of the laser cavity, can be at least partially compensated by adjusting the refractive index of the gain chip, said refractive index adjustments being obtained by acting upon the temperature difference between the temperature of the gain medium, $T_2$, and the environmental temperature, $T_{env}$, so as to reduce (in absolute value) the temperature gradient $\Delta T'=(T_{env}-T_2)$.

In other words, Applicant has realised that the optical effect induced by the temperature difference $|\Delta T|=|T_{env}-T_1|$ can be at least partially compensated by making the temperature of the gain medium, $T_2$, weakly dependent on $T_{env}$ i.e., $T_2(T_{env})$.

Heat transfer through a material, e.g., through the gain chip submount and/or the optical bench, can be expressed by using a thermal property of the material, which is its thermal resistance, R, characteristic not only of the material but also of the geometry involved. The heat transfer can be compared to current flow in electrical circuits and the combination of thermal conductivity, thickness of material and cross-sectional area can be considered as a resistance to this flow. The temperature difference is the potential for the heat flow and the Fourier equation relating the heat flow rate, Q, to the temperature gradient, $\Delta T$ can be written in a form similar to Ohm's law.

For a solid wall of thickness s and surface area A, the thermal resistance can be expressed by the following relationship:

$$R = \frac{\Delta T}{Q} = \frac{1}{\frac{\kappa}{s} \cdot A}, \quad (3)$$

where $\kappa$ is the thermal conductivity of the material, generally expressed in W/mK. Within the temperature range of interest, i.e., the operative temperature range of an external cavity laser for telecommunications, $\kappa$ can be assumed to be essentially independent of the temperature.

Heating of the gain medium generated during operation, which is roughly proportional to the injection current provided to the chip, is to be taken into account. Such a heating, which can be referred hereafter to as self-heating, is independent of the environmental temperature, but it is dependent on the thermal resistance of the heat flow path to the TEC thermal interface at about $T_1$.

To the purpose of reducing the temperature difference $|\Delta T'|$, the Applicant studied a laser module having a configuration such that depicted in FIG. 1, where the submount 9 of the gain chip was made in nickel (Ni), having a thermal conductivity, $\kappa$, of about 61 W/mK, which is much smaller than the thermal conductivity of the submounts generally used in laser modules, for instance SiC ($\kappa$=300-400 W/mK), BeO ($\kappa$=190-210 W/mK) or AlN ($\kappa$=140-180 W/mK). The optical bench was of AlN. The thermal resistance of the Ni submount and the optical bench for the heat flow path from the gain chip to the TEC thermal interface was of about 9-10 K/W. In this way, the gain chip was not fully thermally stabilised, where full thermal stabilisation can be assumed to correspond to a situation in which the gain chip temperature varies with $T_{env}$ within about 1° C. However, heat dissipation was observed to be poor and the temperature on the gain chip was measured to be of 4-5° C. larger than the TEC temperature $T_1$, for environmental temperatures of 25° C. A significant temperature increase due to self-heating of the gain chip reduced the laser chip efficiency.

Applicant has found that "weak" dependence of the temperature of the gain medium on the environmental temperature with the purpose of compensating the effect of mechanical deformations induced by $\Delta T=(T_{env}-T_1)$ can be obtained by thermally bridging the gain medium to the environmental temperature, while maintaining a thermal coupling between the gain medium and a thermally stabilised surface area. Thermal bridge of the gain medium to the environmental temperature is achieved by the use of a thermal bridge element for conducting heat either from or to the gain medium.

FIG. 3 illustrates an equivalent resistance circuit that can help in illustrating the principles underlying the present invention. The gain chip is at a temperature $T_2$ and its heat flow path to the thermally stabilised surface area of the TEC is given by the thermal resistance $R_{OB}$, e.g., the sum of the thermal resistance of the gain chip submount and of the optical bench. The thermal bridge between the gain medium and the environmental temperature, $T_{env}$ is defined by thermal resistance $R_{TB}$.

The gain chip needs to be in thermal coupling to the TEC in order to prevent overheating during operation and in general a large sensitivity of the gain medium to thermal fluctuations. The heat flow path between the gain medium and the TEC thermally stabilised surface is such that its thermal resistance, $R_{OB}$, is preferably smaller than about 10 K/W, and more preferably not larger than 8 K/W, so as a good heat dissipation can be obtained.

Considering a laser assembly housed within a package enclosure, in the following equations, the heat flow contribution of the heat transfer within air from warms areas of the package (e.g., in proximity to the walls of the package in case of $T_{env}$>$T_1$) to cooler areas (e.g., close to the thermally stabilised surface area of the TEC, always for $T_{env}$>$T_1$) on the gain medium, i.e., heat convection, will be disregarded. This assumption is not completely valid, but in practice, for the laser module configurations typically considered, it can be acceptable because the value of the thermal resistance originating from heat convection, $R_c$, is small when compared with the values of $R_{OB}$ and $R_{TB}$.

The power (in Watts) dissipated in the gain medium, $P_0$, is the sum of two contributions: the power dissipated along the heat flow path to the thermally stabilised surface, $P_{OB}$, and the power dissipated along the heat flow path formed by the thermal bridge element, $P_{env}$, $$P_0 = P_{env} + P_{OB} \qquad (4)$$
$$= \frac{T_{env} - T_2}{R_{TB}} + \frac{T_2 - T_1}{R_{OB}}$$
$$= \frac{\Delta T}{R_{TB}} - \frac{\Delta T_{OB}}{R_{TB}} + \frac{\Delta T_{OB}}{R_{OB}},$$

where $\Delta T = (T_{env} - T_1)$ and $\Delta T_{OB} = (T_2 - T_1)$. Within the typical operative temperature range of laser modules for telecommunications, e.g., −5° C. to 70° C., the temperature difference $\Delta T$ can be a positive or a negative value (or zero, when $T_{env} = T_1$), whereas $\Delta T_{OB}$ is generally not smaller than zero because of self-heating of the laser chip during operation.

Equation (4) can be re-written as $$\Delta T_{OB} = \frac{R_{OB} \cdot R_{TB}}{R_{TB} - R_{OB}} \cdot P_0 - \frac{R_{OB}}{R_{TB} - R_{OB}} \cdot \Delta T \qquad (5)$$
$$= \alpha(R_{TB} \cdot P_0 - \Delta T)$$

where $$\alpha = \frac{R_{OB}}{R_{TB} - R_{OB}}. \qquad (6)$$

Applicant has found that in order to realise a weak dependence of the temperature, $T_2$, of the gain medium while ensuring a thermal coupling to the TEC such that excessive self-heating (e.g., >5° C. across the operative temperature range) is avoided, thermal resistance of the heat flow path to the TEC thermal interface, $R_{OB}$, should be smaller than the thermal resistance of the thermal bridge element, $R_{TB}$. Preferably, the value of $R_{TB}$ is at least about 1.5 times the value of $R_{OB}$, i.e., $R_{TB} = c \cdot R_{OB}$, with c being at least about 1.5. More preferably, c is at least about 2 and even more preferably c is comprised between 5 and 12.

In general, if $T_{env} \gg T_1$ (e.g., $\Delta T$>+20° C.), the gain medium is at a temperature, $T_2$, closer to the environmental temperature than the temperature $T_1$. Conversely, if $T_{env}$<$T_1$, the gain chip is at a temperature, $T_2 \geq T_1$ so that the temperature gradient between the gain chip and the stabilised temperature, $\Delta T_{OB}$, is generally either zero or of opposite sign to the temperature gradient between $T_1$ and $T_{env}$. Both for $T_{env}$>$T_1$ and for $T_{env}$<$T_1$, a variation of the optical path length is induced in the direction opposite to the variation of the optical path length caused by mechanical deformations.

When $T_{env}$>$T_1$, mechanical deformations lead to a reduction of the laser cavity optical length, said reduction being approximately proportional to the temperature difference $\Delta T = (T_{env} - T_1)$>0. In this case, the temperature difference between the gain chip and the environmental temperature, $\Delta T' = (T_{env} - T_2)$, is often not smaller than zero, but it is smaller than $\Delta T$. The situation of $\Delta T'=0$ corresponds to the case where $T_2$ is accidentally equal to $T_{env}$, such a situation can occur generally when $T_{env}$ is larger than $T_1$ of not more than about 10° C. Increasing the temperature of the gain medium with respect to the stabilised temperature produces a variation of the refractive index of the gain chip with consequent increase of the optical path length.

When $T_{env}$<$T_1$, mechanical deformations of the optical bench induce an increase of the optical path length approximately proportional to the temperature gradient $\Delta T = (T_{env} - T_1)$<0. There is a temperature gradient, $\Delta T' = (T_{env} - T_2) \leq 0$. Therefore, a reduction of the optical path length of the laser cavity, which compensates the increase of the optical path length caused by mechanical deformations, is achieved.

Preferably, the thermal resistance of the heat flow path from the gain medium to the thermally stabilised surface of the TEC is not smaller than about 5 K/W. For conventional choices of thermally conductive materials and their dimensions in the laser module, the smaller the value of thermal resistance $R_{OB}$, the larger the cross-sectional area ("A" in Eq. (3)) of the thermal bridge element required to produce the desired temperature difference, $\Delta T'$, on the gain medium.

One way to achieve the desired value of the thermal resistance, $R_{OB}$, is by placing the gain chip not above the TEC thermally stabilised surface, but at a certain distance from it. According to a preferred embodiment, the gain medium is placed on a thermally conductive platform having a length larger than the length of the TEC thermally stabilised surface along the longitudinal direction of the optical axis of the laser beam within the cavity. Preferably, the gain medium is placed at a certain distance, $d_1$, along said longitudinal direction, from the thermally stabilised surface of the TEC. Assuming an upper carrier plate of the TEC with a substantially rectangular surface and a laser cavity being arranged so that the main longitudinal optical axis is substantially parallel to a first side edge of the rectangular surface, the distance $d_1$ is essentially parallel to said first side edge of the TEC upper plate.

It is to be noted that compensation of the variation of the optical path length of the laser cavity according to the present invention can be also partial, i.e., in the direction of a significant decrease of said variation without reducing it to zero. Also in case partial compensation is achieved by the present solution, it will be possible to achieve full compensation by making only small adjustments of the injection current of the gain medium, thereby avoiding creation of relatively large fluctuations in the laser output optical power. Preferably, injection current adjustments are within about ±10 mA and more preferably within ±15 mA.

Preferably, the thermal bridge element is structured so as to mechanically disconnect the gain chip from the housing of the package in order to avoid damaging or breaking of the device when the package is subjected to shock or inertial forces. Preferably, the thermal bridge element is a resilient element.

The present invention has the advantage that compensation of the variations of the optical path length of the laser cavity is carried out passively, without the need of introducing an active thermal control and/or an extra electronic control circuit.

BRIEF DESCRIPTION OF THE DRAWINGS

FIG. 10 is a portion of the cross-sectional view of FIG. 9 illustrating the situation where an external force is exerted on the package feed-through.

DETAILED DESCRIPTION OF THE INVENTION

According to the preferred embodiments of the present invention, the external-cavity laser is a tuneable laser including a gain medium emitting a light beam, a grid generator and a channel selector, both grid generator and channel selector being located along the optical path of the beam exiting the gain medium. The grid generator selects periodic longitudinal modes of the cavity at intervals corresponding to the channel spacing and rejects neighbouring modes. The channel selector selects a channel within the wavelength grid and rejects other channels.

Preferably, the channel selector is a tuneable mirror, which forms an end mirror of the external cavity and defines it in length together with the reflecting front facet of the gain medium, e.g., a semiconductor laser diode. In other words, the tuneable mirror functions both as channel selector and as end mirror for the laser cavity.

The grid generator is preferably a Fabry-Perot (FP) etalon, which is structured and configured to define a plurality of equally spaced transmission peaks. In applications for WDM or DWDM telecommunication systems, transmission peak spacing, i.e., the free spectral range (FSR) of the grid element, corresponds to the ITU channel grid, e.g., 50 or 25 GHz.

When present in the laser cavity together with the grid generator, the tuneable mirror serves as the coarse tuning element that discriminates between the peaks of the grid generator. For single-mode laser emission, a longitudinal cavity mode should be positioned over the maximum of one of the grid transmission peaks (the one selected by the tuneable mirror). In this way, only the specified frequency will pass through the grid and the other competing neighbouring cavity modes will be suppressed. Wavelength selectivity of the tuneable mirror is preferably achieved by an electrical signal. The tuneable mirror of the present invention preferably comprises an electro-optically tuneable material, more preferably a liquid crystal (LC) material. In case of a LC-based tuneable mirror, the applied voltage is an ac voltage.

Figure 4:
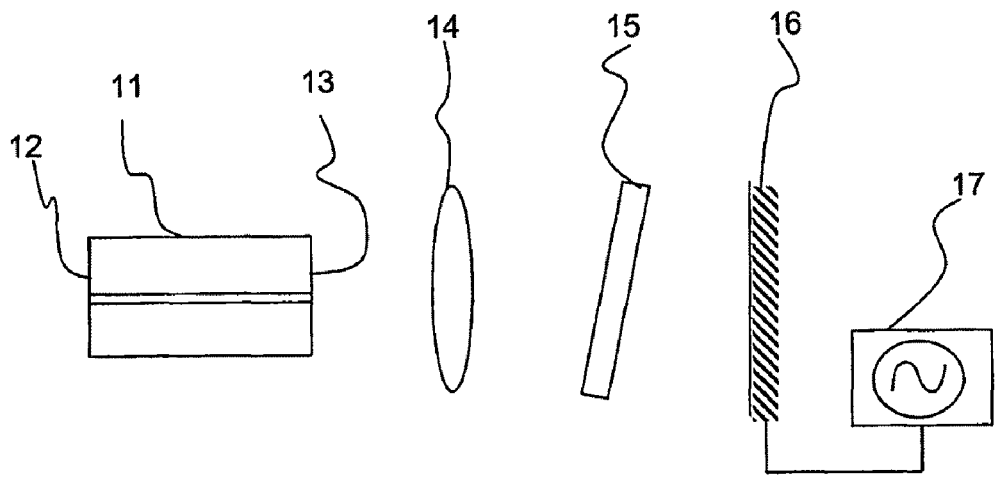
FIG. 4 is a block diagram of the external-cavity laser assembly according to an embodiment of the present invention.

FIG. 4 schematically illustrates the layout of an external-cavity laser comprising a tuneable mirror. Gain medium 11 comprises a front facet 13 and a back facet 12. Back facet 12 is partially reflecting and serves as one of the end mirrors of the external cavity. Front facet 13 has a low reflectivity. It is typically coated with an anti-reflection coating (not shown). A collimating lens 14 converges the optical beam emitted by the gain medium onto a FP etalon 15, which has the modes locked to the ITU channel grid. After the FP etalon 15, the beam impinges on a tuneable mirror 16, which forms the other end mirror of the external cavity and together with the gain medium back facet defines the cavity physical length, $L_o$. The tuneable mirror is tuned to the desired channel frequency by selecting one of the etalon transmission peaks. The tuneable mirror 16 is tuned electronically by varying the applied voltage supplied by a voltage generator 17.

For the laser effect to occur in the laser cavity, two conditions should be met: the condition for resonance and the condition for gain, which can be expressed, respectively, by the following equations $$2j\Phi_{LD}+2j\Phi_{FS}+2j\Phi_{FP}+j\Phi_{r2}=2jN\pi \quad (7)$$

$$G_{LD}^2(\lambda)G_{FP}^2(\lambda)\cdot r_1\cdot r_2(\lambda)=1 \quad (8)$$

where N is an integer number, $G_{LD}$ is the spectral gain of the laser diode, $\phi_{LD}$ is the phase delay introduced by the laser diode, $\phi_{FP}$ is the phase delay introduced by the etalon, $\phi_{FS}$ is the phase delay introduced by the free space, $G_{FP}$ is the transmission spectrum of the etalon, $r_1$ is the reflectivity of the front facet of the laser diode, $r_2(\lambda)$ is the reflectivity of the tuneable mirror, and $\phi_{r2}$ is the phase delay introduced by the tuneable mirror.

Equations (7) and (8) can be combined to obtain the laser cavity modes $$G_{LD}^2(\lambda)e^{2j\Phi_{LD}}\cdot e^{2j\Phi_{FS}}\cdot G_{FP}^2(\lambda)\cdot e^{2j\Phi_{FS}}\cdot r_1\cdot r_2(\lambda)\cdot e^{j\Phi_{r2}}=e^{2jN\pi} \quad (9).$$

Figure 2:
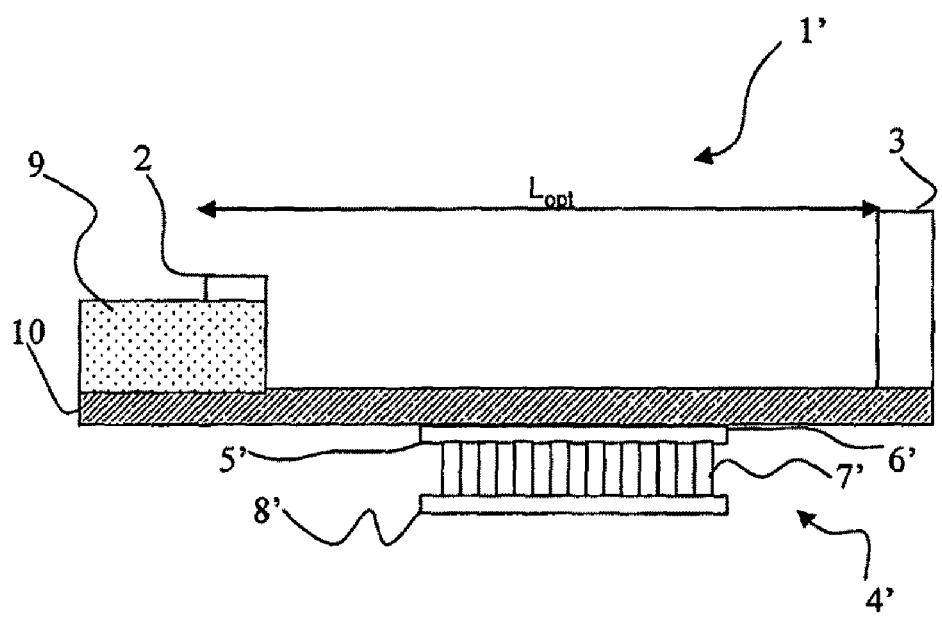
FIG. 2 is a schematic diagram illustrating the laser external cavity of FIG. 1, in which thermal stabilisation is lessened due to a thermoelectric cooler of reduced dimensions with respect to the laser cavity.
Figure 3:
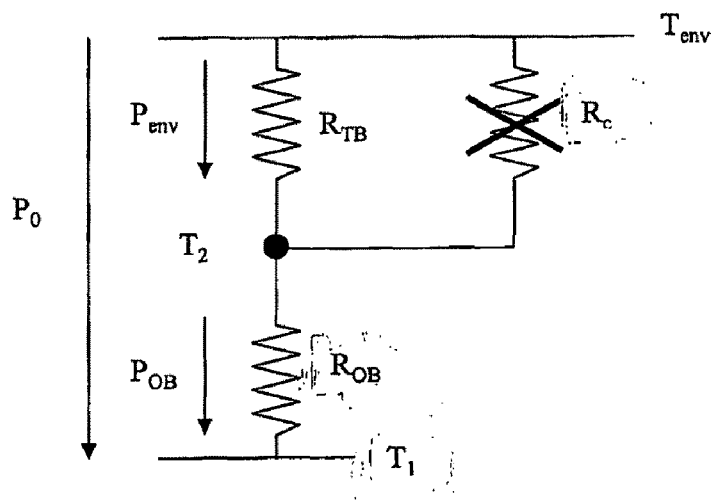
FIG. 3 illustrates an equivalent resistance circuit representing the heat flow path to and from the gain medium of an external laser cavity according to the invention.
Figure 5:
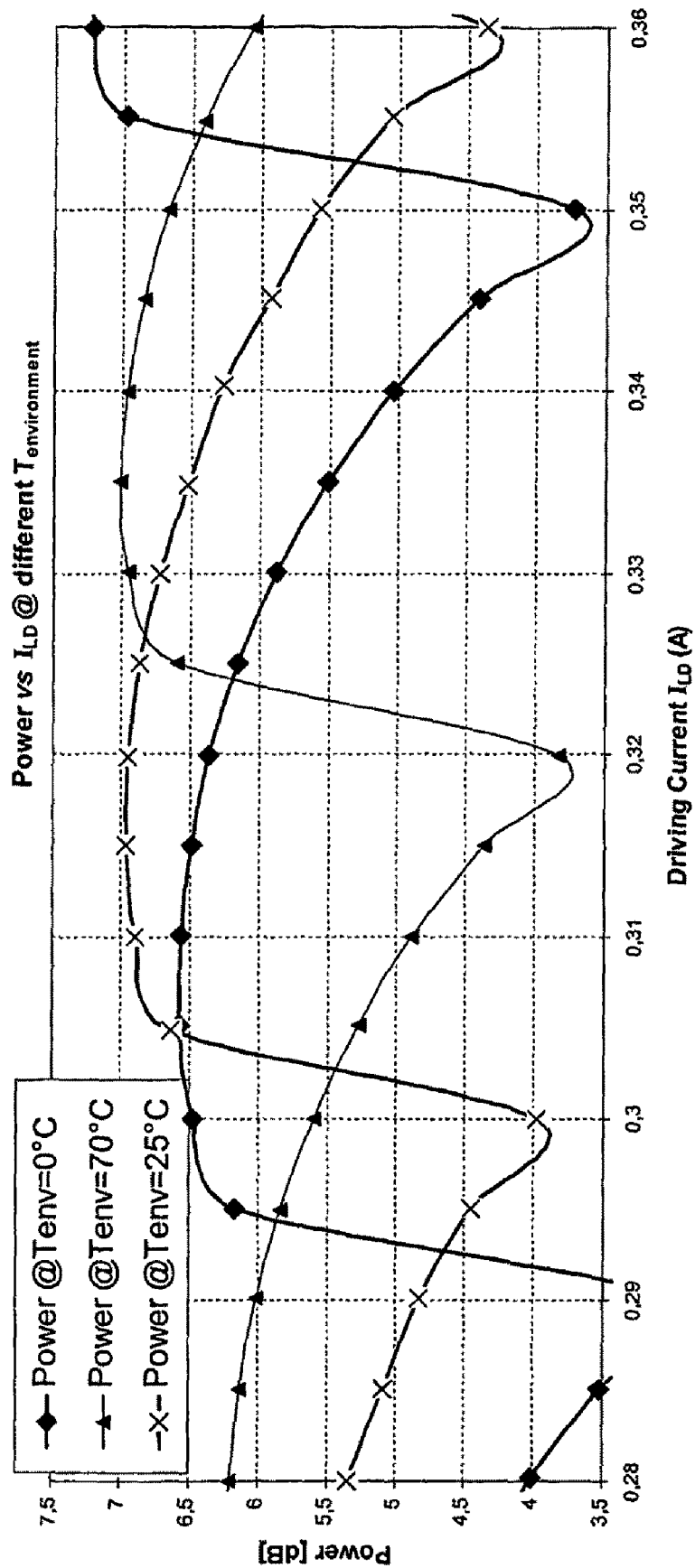
FIG. 5 shows exemplary measurements of the laser output power as a function of the injection current for different environmental temperatures.

FIG. 5 shows a few exemplary measurements of the laser output power as a function of the injection current of the laser diode for three different environmental temperatures, $T_{env}$. The laser configuration is generally similar to that in FIG. 2, but with the end mirror positioned on the optical bench in correspondence to the TEC upper carrier plate. The gain chip was positioned in the laser cavity such that the thermal resistance, $R_{OB}$, to the thermally stabilised TEC was of about 6.5-7 K/W. It is clear from FIG. 5 that an increase of the environmental temperature leads to a shift of the local maxima of the output power towards higher injection currents. This effect is deemed to be mostly due to a decrease of the physical length of the laser cavity, $L_0$, and thus of $\phi_{FS}$. Assuming that also the FP etalon and the tuneable mirror are thermally stabilised, contributions from the etalon and of the tuneable mirror to the temperature dependence of the phase delay of the laser cavity can be disregarded.

If the gain chip is fully thermally stabilised (e.g., within $\approx 1°$ C.), its phase delay, $\phi_{LD}$, depends essentially on the injection current, $I_{LD}$. The local maxima in the output power correspond to the condition of optical power alignment of the cavity modes with the (selected) etalon peak.

In case of occurrence of mechanical deformations of the TEC, which are induced by variations of the environmental temperature, $T_{env}$, the free-space phase delay, $\phi_{FS}$, undergoes variations and then Eq. (7) can be written by highlighting the temperature dependence of $\phi_{FS}$ and the dependence of the phase delay of the laser diode on the injection current as $$2j\Phi_{LD}(I_{LD})+2j\Phi_{FS}(T_{env})+2j\Phi_{FP}+j\Phi_{r2}=2jN\pi \qquad (10)$$

Compensation of the variation of the free-space phase delay to achieve precise channel alignment of the cavity mode could be thus attained by adjusting the injection current of the laser diode. In other words, by adjusting the injection current, the position of cavity mode can be centred under the selected etalon peak (i.e., lasing channel) thereby bringing the output power to a local maximum (FIG. 5). Monitoring the output power could therefore be employed for adjustments of channel alignments so that the following relationship is satisfied:

$$\Phi_{LD}(I_{LD})+\Phi_{FS}(T_{env})=\text{constant} \qquad (11).$$

However, Applicant has noted that within a typical operative temperature range of the laser assembly, i.e., $-5°$ C., $+70°$ C., variations of the injection current necessary to satisfy Eq. (11) can be up to about 40 or even 60 mA. Such current variations lead to variations in the output optical power as high as about 1 dB, clearly unacceptable when a high stability of the laser output is required.

The Applicant has considered acting upon the phase delay of the gain chip by thermally varying the refractive index of the gain chip so as to compensate the variation of the free-space phase delay caused by mechanical deformations of the TEC. It has been found that thermally bridging the gain medium to the environmental temperature so that the heat flow path to $T_{env}$ has a thermal resistance, $R_{TB}$, larger than that of the heat flow path from the gain medium to $T_1$ (the thermally stabilised surface) can compensate, at least partially, the variation of the optical path length due to mechanical deformations.

Figure 6:
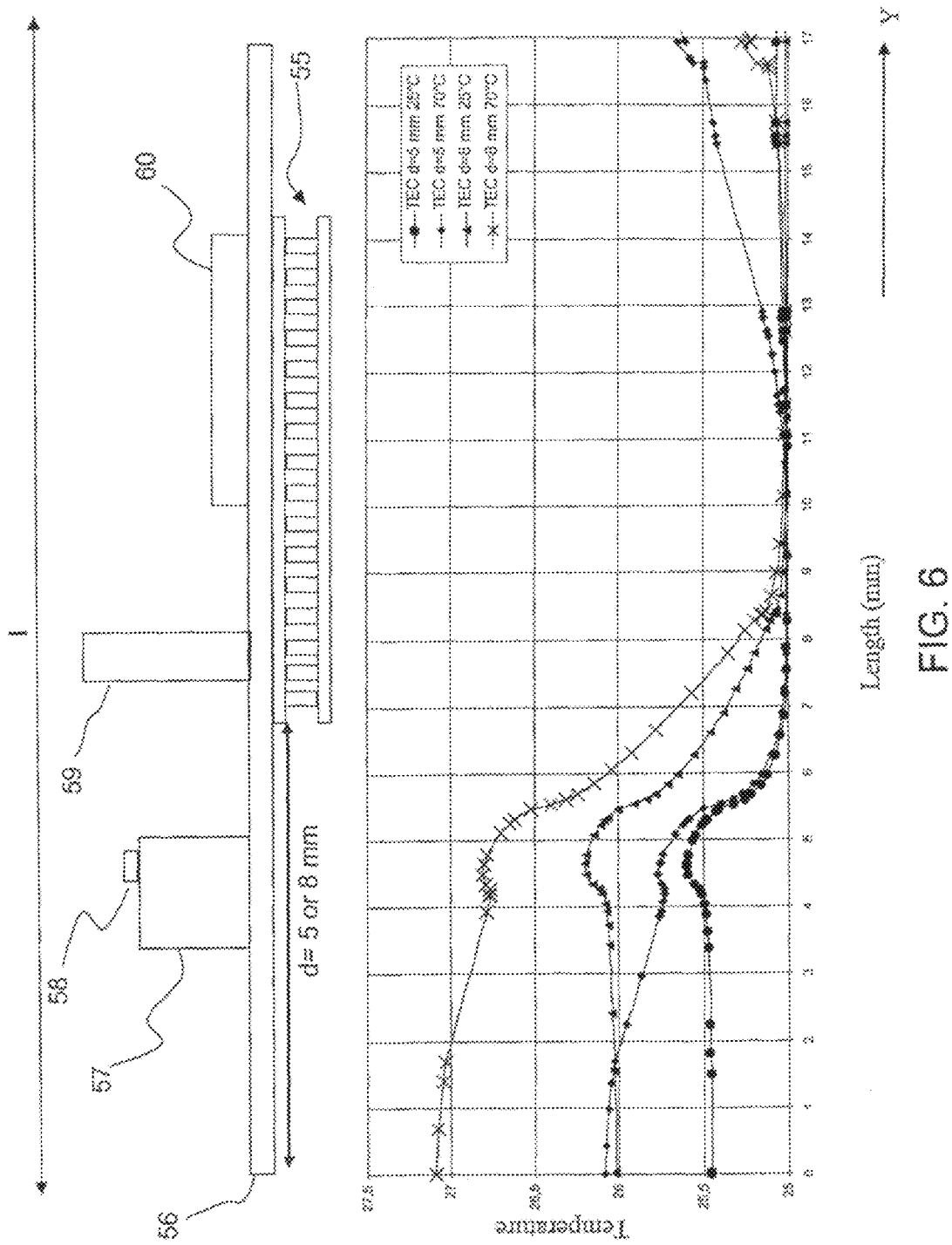
FIG. 6 shows computer simulations of the temperature as a function of the length of an optical bench mounting an external cavity along the main longitudinal direction of the optical bench, which is substantially parallel to the main optical axis of the optical beam within the cavity.

FIG. 6 shows computer simulations of the temperature curves vs. length of the optical bench mounting a laser assembly. Optical bench 56 is placed on a TEC 55 with surface area of the thermally stabilised surface of 8×8 mm² (i.e., the TEC upper carrier plate is a square-shaped plate) said surface being stabilised at a temperature $T_1=25°$ C. Simulations were carried out at two different environmental temperatures, $T_1=25°$ C. (i.e., equal to the temperature at which the TEC is set) and $T_{env}=70°$ C. The optical bench is a rectangular-shaped plate of length, 1, of 17.5 mm (along the Y-axis) and width of 7.2 mm. The optical bench 56 is placed on the TEC upper plate at two different positions along the longitudinal main direction of the optical bench (i.e., Y axis), which correspond to two different distances, d, along the Y direction, between the edge of the optical bench and the edge of the TEC upper carrier plate. The optical axis of the laser cavity is substantially parallel to the Y direction. The two distances d, which are 5 and 8 mm, in turn correspond to two different distances, $d_1$, of about 1 mm and 4 mm, respectively, of the gain chip from the upper plate of the TEC. The optical bench 56 is assumed to have a thermal conductivity of about 180 W/mK, while the submount 57 is assumed to have a thermal conductivity of 160-190 W/mK. In simulations, the laser cavity included a FP etalon 59 and a tuneable mirror 60. Both the FP etalon and the tuneable mirror are placed on a surface area of the optical bench at a zero longitudinal distance (i.e., along the Y-axis) from the thermally stabilised surface of the TEC 55.

A slight increase (within about $1°$ C.) of the temperature in correspondence to the gain chip can be seen also for $T_{env}=T_1$ (solid triangles and solid circles in FIG. 6), due to self-heating of the gain chip during operation and to the fact that the gain chip is positioned at $d_1$ from the TEC thermally stabilised surface. It is clear from FIG. 6 that to larger distances $d_1$ there correspond larger temperature gradients on the gain chip. For $T_{env}=70°$ C. ($\Delta T=45°$ C.) and $d_1=4$ mm, $\Delta T_{TB}\approx1.7°$ C. If the distance $d_1$ is smaller than about 2 mm ($d_1=0$—not shown in the figure—corresponds to the case the gain chip is placed directly above the TEC upper carrier plate), the gain chip undergoes relatively small temperature variations with $T_{env}$ for $\Delta T\gg0$ (i.e., a small reduction of $\Delta T'=(T_{env}-T_2)$ is obtained), which can be not sufficient to significantly compensate the variations of optical path length due to mechanical deformations of the TEC.

Applicant has observed that also in case of a gain chip placed at a relatively large distance from the closest side edge of the TEC upper plate, e.g., $d_1=4$ mm, the temperature gradient can be not sufficient to bring a beneficial contribution to the reduction of the optical path length variation. Since larger longitudinal distances from the edge of the TEC are often not feasible in designs of commercial external-cavity lasers, such as in case of transmitters for WDM/DWDM systems (reference is made also to Eq. (1)) and/or because of package constraints, Applicant has found that the temperature gradient on the gain chip, $\Delta T'$, can be reduced by thermally bridging the gain chip with the environmental temperature, i.e., by the use of a thermal bridge element that thermally connects the gain chip to a component placed at about the environmental temperature, while maintaining a thermal coupling between the gain chip and the TEC.

Laser assemblies are typically housed in a package that protects the laser components and other electronic or thermoelectric components associated to the laser assembly from the external environment. External cavity lasers for telecommunications are generally housed in hermetically sealed packages so as to allow the laser assembly to be sealed within an inert atmosphere to prevent contamination/degradation of the optical surfaces of the various components of the laser.

It has been found that a thermal bridge element can thermally couples the gain chip to a portion or a component of the package placed at about the environmental temperature. Thermal exchange between the gain chip and the package portion at about the environmental temperature depends on the thermal resistance of the bridge element, which depends on the thermal conductivity of the material forming the element, its cross-sectional area and its length, equivalent to thickness "s" in Eq. (3).

Figure 1:
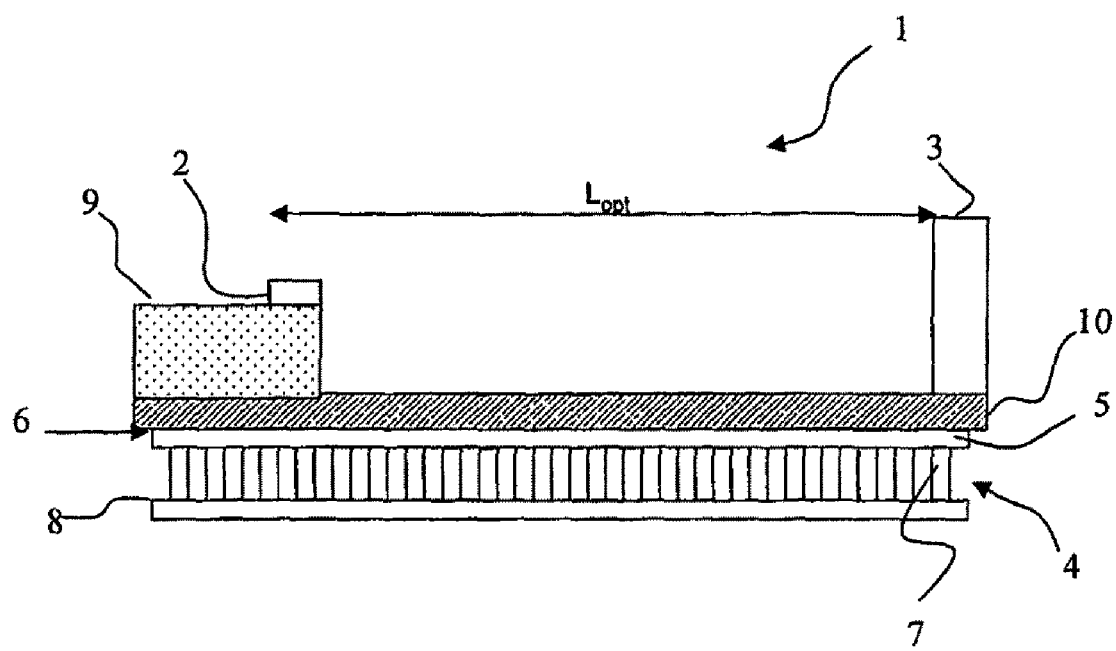
FIG. 1 is a schematic diagram illustrating a laser external cavity thermally stabilised by means of a thermoelectric cooler.

It would be in principle possible to obtain a temperature difference on the gain chip by employing a thermal bridge element in a laser cavity wherein the gain chip is placed above the TEC (as for instance depicted in FIG. 1), when optical benches and gain chip submounts are made of materials with $\kappa$ larger than about 120 W/mK. For instance, a laser module with a configuration of FIG. 1, i.e., the gain chip is placed above the TEC on an AlN submount on an AlN optical bench, can have a thermal resistance $R_{OB}$ of about 2-3 K/W, depending on the dimensions and thermal conductivity of the optical bench and submount. However, this would require the use of a bridge element having a rather small thermal resistance, $R_{TB}$, e.g., having a rather large cross-sectional area. In most commercial packages housing tuneable lasers for telecommunications, the large dimensions of the thermal bridge element necessary to produce a significant temperature gradient (e.g., $\Delta T' \approx \pm 2\text{-}3°$ C.) would render employment of a thermal bridge element unfeasible. Furthermore, a large cross-section is less preferred because to a larger cross-section of the thermal bridge element there corresponds a larger rigidity of the element.

It is therefore preferred that the thermal resistance of the heat flow path between the gain chip and $T_1$, $R_{OB}$, is not smaller than 5 K/W.

Figure 7:
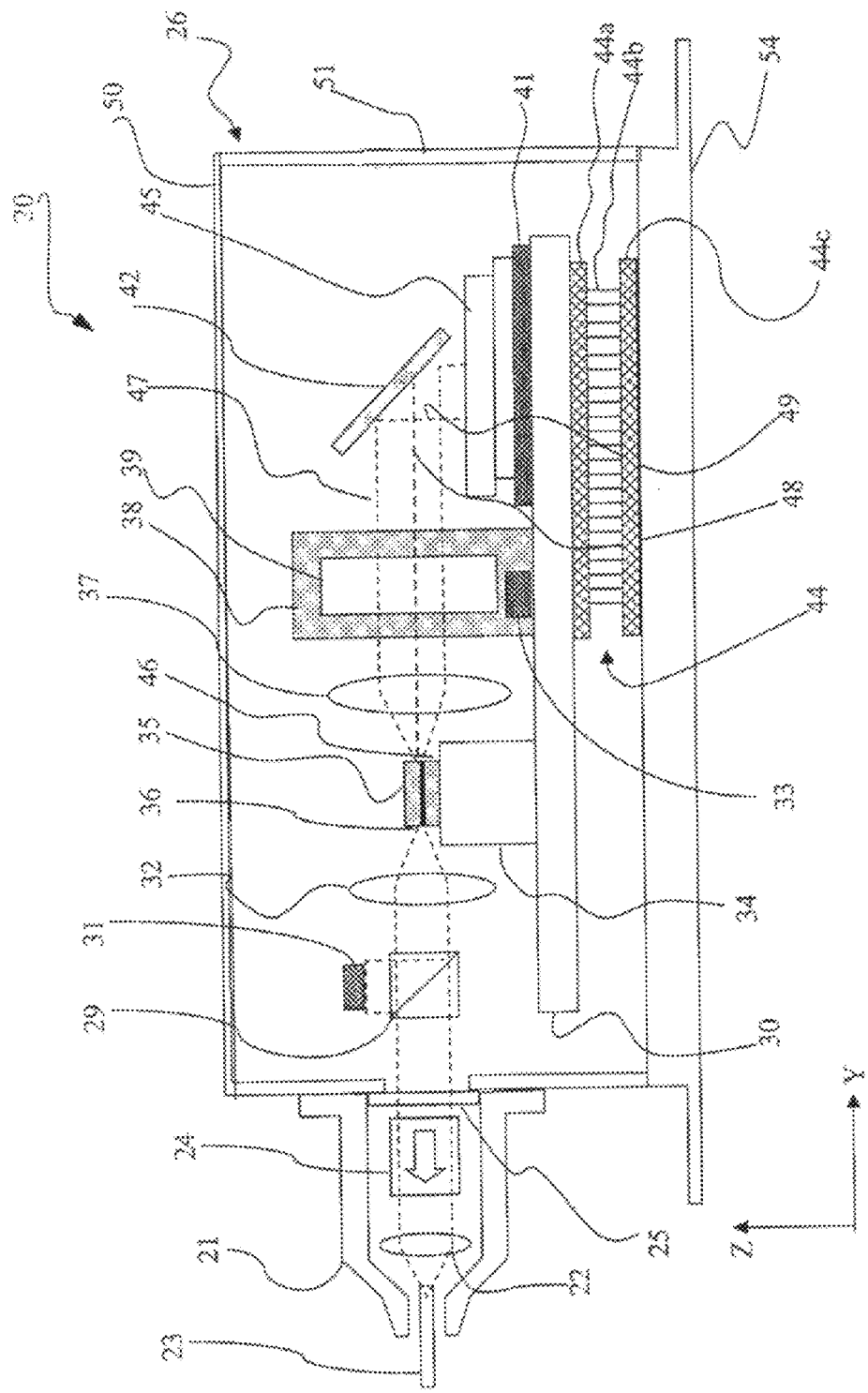
FIG. 7 is a lateral view of a laser module according to a first preferred embodiment of the present invention.

A tuneable laser module according to a preferred embodiment of the present invention is schematically depicted as a side view in FIG. 7. The laser module 20 comprises an external cavity laser assembly housed in a package 26, e.g., a 14-pin butterfly package, which defines an enclosure 51 including four lateral walls (only two walls are shown in FIG. 7). The package 26 comprises a base 54 and a lid 50. The lid seals hermetically the enclosure. The package includes a boot 21 for the insertion of an optical fibre, i.e., fibre pigtail 23. A glass window 25 closes up hermetically the laser assembly from the boot for fibre insertion. The laser assembly includes a gain medium 35, a collimating lens 37, a grid generator 39, a deflector 42 and a tuneable mirror 45. The gain medium 35 is based on a semiconductor laser chip, for example an InGaAs/InP multiple quantum well Fabry-Perot (FP) gain chip especially designed for external-cavity laser applications. The diode comprises a back facet 36 and a front facet 46. The diode's front facet 46 is an intracavity facet and has an anti-reflection coating. Preferably, the gain chip waveguide is bent so that it has an angled incidence on the front facet in order to further reduce back reflections. The back facet 36 is partially reflective and serves as one of the end mirrors of the external cavity. The reflectivity of the back facet can range for instance between 10% and 30% in order to allow a relatively high laser output power.

Within the laser cavity, the emerging beam from the laser chip front facet 46 is collimated by collimating lens 37 that collimates the beam to define an optical path 47. The collimated beam impinges onto grid generator 39.

The laser assembly is placed on a thermally conductive platform 30, i.e., the optical bench, which functions also as mechanical reference base for the optical elements. The use of a common optical bench is preferred because it minimises the design complexity and simplifies the alignment between the components of the tuneable laser. The platform 30 is made of any thermally conductive material, such as aluminium nitride (AlN), silicon carbide (SiC) and copper-tungsten (CuW).

The thermally conductive platform 30 is thermally contact with a TEC 44 including an upper carrier plate 44a, a Peltier cell 44b and a lower carrier plate 44c. TEC 44 provides thermal control for the platform by stabilising the temperature of the upper carrier plate 44a, which is in thermal contact with the optical bench 30. For instance, the platform 30 can be glued or soldered to the upper carrier plate 44a so as to minimise the thermal resistance between the surface where the optical components are mounted and the thermally stabilised surface. The lower carrier plate 44c is secured on the base 54 of the package. Temperature monitoring of the thermally conductive platform is provided by a thermal sensor device 33, such as a thermistor or a thermocouple, which is placed on the platform and is operatively coupled to the TEC so as to provide control signals to cool or heat the surface of the TEC in thermal contact with the platform 30, and thus to heat or cool platform 30 in order to maintain an approximately constant temperature, $T_1$. In the embodiment of FIG. 7, the thermal sensor device is placed in proximity of the FP etalon 39, for control of its thermal stability. The lower carrier plate 44c of the TEC 44 is placed at about the environmental temperature, $T_{env}$, on the internal surface (i.e., internal with respect to the enclosure) of base 54.

The gain chip 35 is preferably placed, e.g., by bonding, on a thermally conductive submount 34 so as to position the emitted beam at a convenient height with respect to the other optical elements and to further improve heat dissipation. The thermally conductive sub-mount 34, made for instance of SiC, is placed on the thermally conductive platform 30.

The length of the platform 30 substantially along the main longitudinal direction Y is substantially parallel to the main optical axis of the optical beam within the laser cavity and it is larger than the length of upper carrier plate 44a (always along the Y direction). The gain chip 35 is placed at a certain longitudinal distance, along Y, from the edge of the upper plate of the TEC. The position of the gain chip is selected so that a temperature difference, $\Delta T'$, not larger than 5° C. is created between the gain chip temperature and $T_{env}$ for an environmental temperature largely different (e.g., more than 10-15° C. and typically not larger than 45-50° C.) from the stabilised temperature, $T_1$. Preferably, $\Delta T'$ is comprised between 2° C. and 5° C., depending also on the magnitude of the mechanical deformations to be compensated.

The grid generator 39 is preferably a FP etalon. The laser can be designed in such a way that the operating wavelengths are aligned with the ITU channel grid. In this case, the laser wavelength is centred to the ITU grid via the FP etalon 39, which is structured and configured to define a plurality of equally spaced transmission peaks. In applications for WDM or DWDM telecommunication systems, transmission peak spacing, i.e., the FSR of the grid element, corresponds to the ITU channel grid, e.g., 50 or 25 GHz. In order to stabilise its temperature, the FP etalon 39 is preferably housed in a thermally conductive housing 38 to promote thermal contact with the platform 30.

After the FP etalon 39, the laser beam strikes a deflector 42 that deflects the beam 47 onto a tuneable mirror 45 along optical path 49. The tuneable mirror 45 reflects the light signal back to the deflector 42, which in turn deflects the light signal 48 back to the gain medium 35. The deflector 42 is in this embodiment a planar mirror, for instance a gold-coated silicon slab.

Although not shown in FIG. 7, the deflector can be secured in the cavity for instance by means of a support structure that is fixed to the platform 30. The deflector can be glued to the support structure or, if it is at least partly metallised, soldered. Preferably, the deflector is aligned to the laser beam by means of active optical alignment techniques.

The tuneable mirror 42 is an electro-optic element, in which tunability is achieved by using a material with voltage-dependent refractive index, preferably a liquid crystal (LC) material. For example, a tuneable mirror is that described in WO patent application No. 2005/064365. The tuneable mirror serves as the coarse tuning element that discriminates between the peaks of the FP etalon. The FWHM bandwidth of the tuneable element is not smaller than the FWHM bandwidth of the grid etalon. For longitudinal single-mode operation, the transmission peak of the FP etalon corresponding to a particular channel frequency should select, i.e., transmit, a single cavity mode. Therefore, the FP etalon should have a finesse, which is defined as the FSR divided by the FWHM, which suppresses the neighbouring modes of the cavity between each channel. For single-mode laser emission, a longitudinal cavity mode should be positioned over the maximum of one of the etalon transmission peaks (the one selected by the tuneable element). In this way, only the specified frequency will pass through the etalon and the other competing neighbouring cavity modes will be suppressed.

According to the present embodiment, the external laser cavity is a folded resonant cavity having an optical path length, which is the sum of the optical path 47 between the back facet 35 of the gain medium and the deflector 42 and the optical path 49 between the deflector and the tuneable mirror 45.

The laser beam is coupled out of the external cavity by the partially reflective back facet 36 of the laser diode 35. Preferably, a collimating lens 32 can be placed along the optical path of the laser output beam. In the present embodiment, a beam splitter 29, e.g. a 98%/2% tap, which is placed after lens 32, picks off a portion of the output light as a test beam, which is directed to a photodetector 31 for power control. A fibre focus lens 22 directs the light, which has passed through an optical isolator 24, into fibre pigtail 23. Optical isolator 24 is employed to prevent back-reflected light being passed back into the external laser cavity and is generally an optional element.

In the preferred embodiments, the laser assembly is designed to produce substantially single longitudinal and, preferably, single-transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or single transversal, mode operation. The laser is operative to emit a single longitudinal mode output, which depends on the spectral response of the optical elements within the cavity and on the phase of the cavity.

Although not shown in FIG. 7, lenses 32 and 37 are mounted to the platform by individual mounts.

The FP etalon 39 and the tuneable mirror 45 are mounted on the surface area of the optical bench 30 placed above the upper carrier plate 44a of the TEC 44 in order to minimise the thermal resistance of the heat flow path. The thermal resistance of the heat flow path between the tuneable mirror and the TEC surface is preferably smaller than the thermal resistance, $R_{OB}$, between the gain chip and the TEC surface. The thermal resistance between the tuneable mirror and the TEC thermally stabilised surface is preferably not larger than 2 K/W, more preferably not larger than 1 K/W.

The tuneable mirror 45 lays substantially horizontally with respect to the principal surface plane of the thermally conductive platform 30. In a preferred embodiment, the tuneable mirror is placed onto a thermally conductive substrate or in a holder (indicated with 41 in FIG. 7) that can house the tuneable mirror. In case the platform 30 is made of a metallic material, the substrate or holder 41 should be made of an electrically insulating material (with high thermal conductivity) in order to avoid an electrical contact between the tuneable mirror and the platform, As the tuneable mirror is normally biased during laser operation. In a preferred embodiment, the holder 41 is made of AlN or SiC.

By laying the tuneable mirror horizontally on the platform, the thermal contact with the platform is maximised while there is no need of actively aligning the mirror with respect to the laser beam during laser assembly. Preferably, during laser assembly, the tuneable mirror is bonded onto the thermally conductive platform by means of a thermally conductive epoxy, for instance Ag-filled epoxy, or of silicone resin. Alternatively, the tuneable mirror is housed in a holder or placed on a substrate that is bonded to the thermally conductive platform. The mirror can be glued to the substrate or holder. What needs to be aligned to the laser beam, preferably by optical active alignment techniques, is the deflector 42.

For a laser configuration having the tuneable mirror "horizontal" with respect to the optical bench, maximum temperature variations of the tuneable mirror remain lower than 0.1° C. across the temperature operating range from −10 to 70° C., even when the dissipated power of the tuneable mirror, which is due to the applied voltage, is as high as 50 mW.

It is however to be understood that the present invention envisage as alternative preferred embodiment also an external cavity laser assembly, wherein the tuneable mirror is positioned substantially perpendicularly to the optical beam (as schematically shown in FIG. 4).

Figure 8:
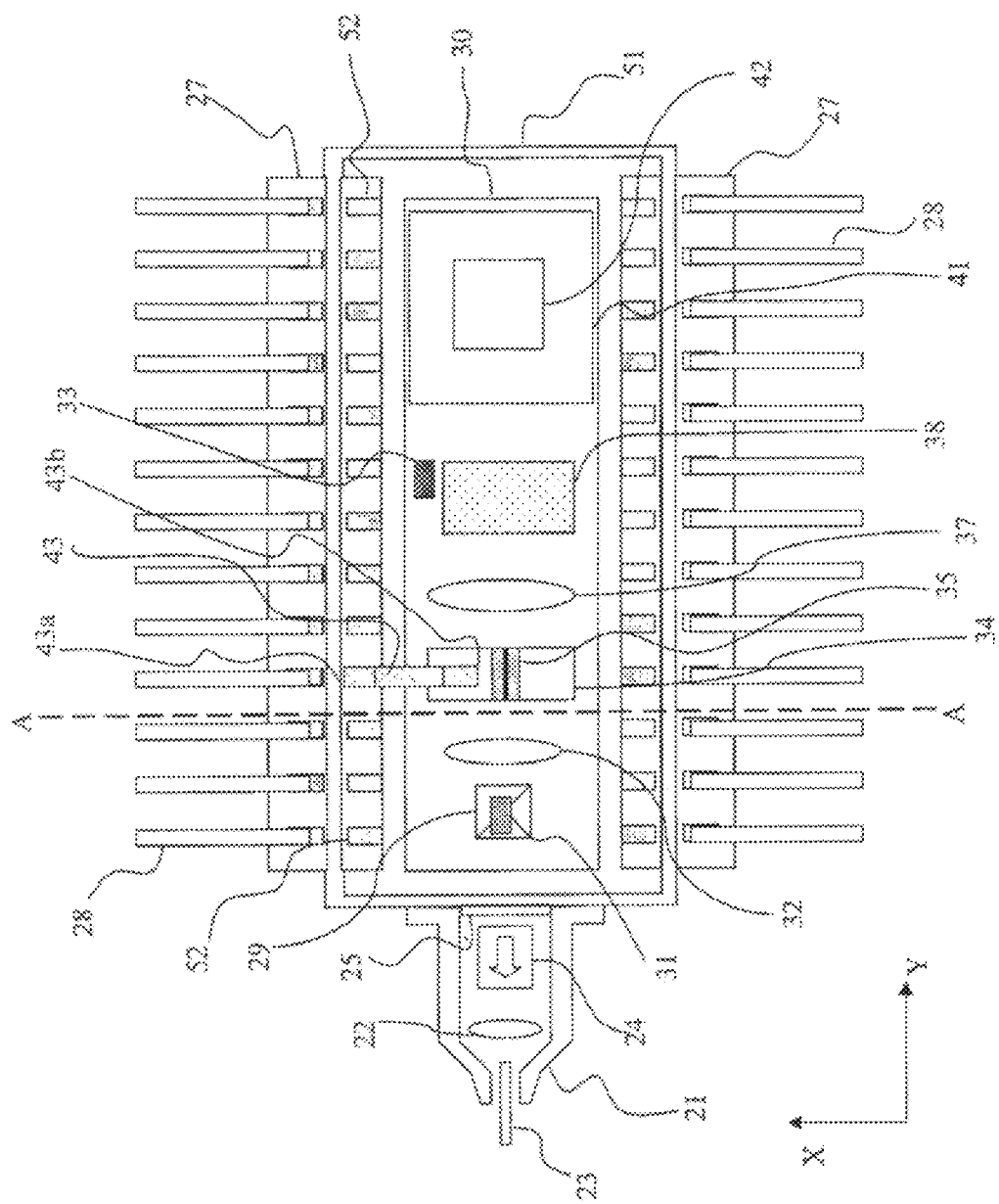
FIG. 8 is a top plan view of the laser module illustrated in FIG. 7.

FIG. 8 is a top plan view of the laser module shown in FIG. 7. The lid (not shown) of the case is omitted in FIG. 8 for clarity. The same reference numerals are given to elements of the tuneable laser module corresponding to those shown in FIG. 7 and their explanation will be omitted. In the embodiment shown in FIGS. 7 and 8, the package is a butterfly package including a plurality of electrical leads (i.e., pins) for electrical connections of the components in the interior of the housing 51, such as the gain medium, the TEC, the tuneable mirror, and possibly to other components such as the thermistor 33. The electrical leads 28 are soldered on the electrically conductive pads 52 of a feed-through ceramic structure 27 that provides an electrical interconnect into or out of the enclosure 51, while maintaining the package hermeticity.

A thermal bridge element 43 is placed on the submount 34 in proximity of the gain chip 35. The thermal bridge element 43 thermally couples the gain chip to a region of the package that is in thermal contact with the environmental temperature. In particular, the thermal bridge element 43 has two peripheral ends 43a and 43b, a first end, 43b, is placed in proximity of the gain chip 35, whereas a second end, 43a, is placed on a portion of the package.

Ideally, the thermal bridge element should be placed in physical contact with the gain chip so as to maximise the thermal effect. The chip submount, being made of a thermally conductive material, tends to quickly dissipate the heat conducted along the thermal bridge element. However, some laser chips, such as a standard InGaAs semiconductor laser chips, have relatively small dimensions (e.g., for example a surface area of 0.5×1 mm$^2$) and are rather easily breakable, which makes often undesirable to bond/solder the thermal bridge element directly on the gain chip. In such cases, the thermal bridge is placed on the gain chip submount in close proximity, e.g., within 2 mm from an edge of the gain chip.

The region of the package that is in thermal contact with the environmental temperature on which an end of the thermal bridge element is placed is preferably a surface portion of the package feed-through 27, in particular on its upper surface, as illustrated in FIG. 8. For instance, an end of the thermal bridge is soldered by known methods on a metallic bonding pad 52 of the feed-through 27. Although it is preferred that the thermal contact of the gain chip with the package is made with the package feed-through, because of its relatively small physical distance with the gain chip, it is to be understood that different configurations of the thermal bridge element and/or of the position of the gain chip within the package can include a thermal connection between the gain chip and the package, e.g., the base 54 or a lateral wall of the enclosure 51.

The thermal bridge element is made of a thermally conductive material, for example of Cu having a thermal conductivity of about 400 W/mK. The smaller the value of the thermal conductivity, the larger needs to be the cross-sectional area of the thermal bridge to maintain the desired thermal resistance, according to Eq. (3). However, a larger cross-sectional area is often not preferred because it increases the rigidity of the thermal bridge and its encumbrance. A preferred material is copper. In the embodiment described with reference to FIGS. 7 and 8, the thermal bridge element is made of soft copper, which has a relatively low Young's modulus of about 100 GP (i.e., low mechanical rigidity), which provides for a good mechanical workability. A coating of gold or silver can be formed on the copper element in order to facilitate the soldering of the bridge element to the package components, such as the solder pads 52 of the ceramic feed-through 27.

The thermal bridge element 43 can be soldered to the feed-through 27 and to the submount 34 by means of known soldering techniques, for example by using eutectic soldering alloys, such as AuSb.

Figure 9:
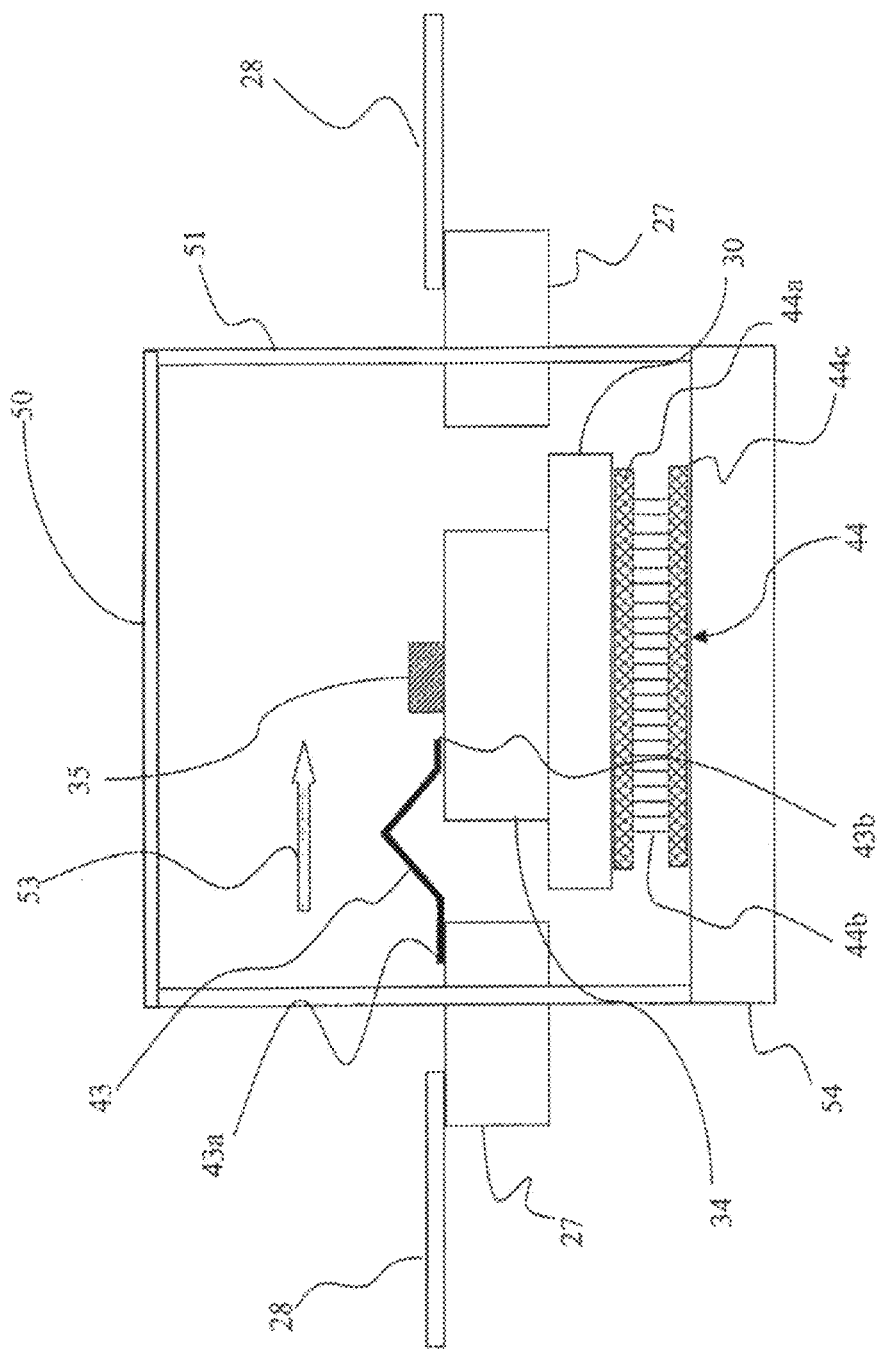
FIG. 9 is a cross-sectional view of a laser module along line AA of FIG. 8, in which a mechanical schematic cross-sectional view of a thermal bridge element is shown.

FIG. 9 is a cross-sectional view along line AA of FIG. 8. A transversal cross-sectional view of the thermal bridge element 43 shown in the figure.

The thermal bridge element 43 has a resilient structure so as to mechanically de-couple the gain chip, and in general the optical bench, from external stresses transmitted through the external walls of the package housing or the feed-through/pins of the package. In other words, the thermal bridge element has preferably a spring-like behaviour along the longitudinal direction indicated by arrow 53.

Figure 10:
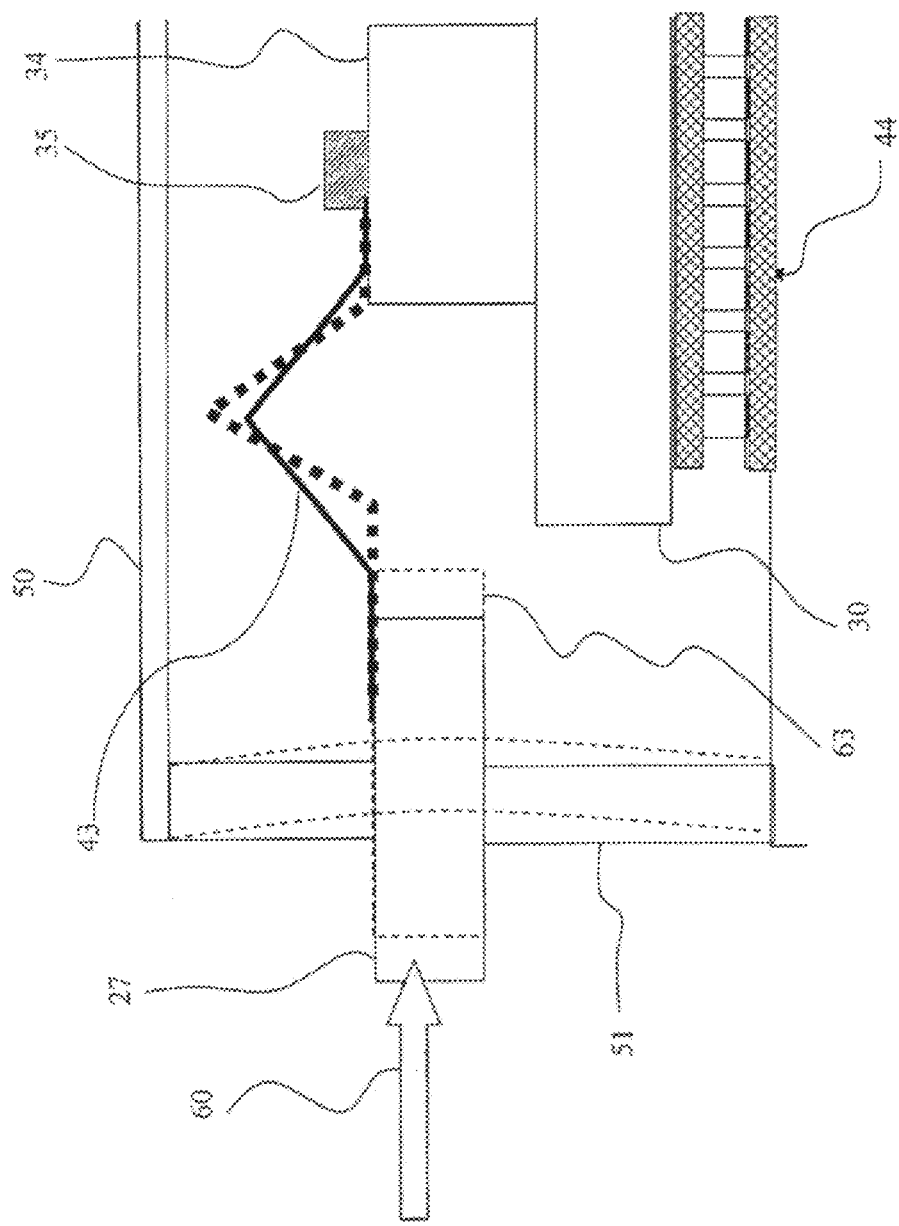

FIG. 10 schematically illustrates the situation when a force along arrow 60 is exerted on the package feed-through structure 27, and thus on a lateral wall of enclosure 51 fitting the feed-through. The thermal bridge element 43 in response to the force undergoes a lateral mechanical compression, thereby avoiding damaging or breaking the gain chip.

Figure 11:
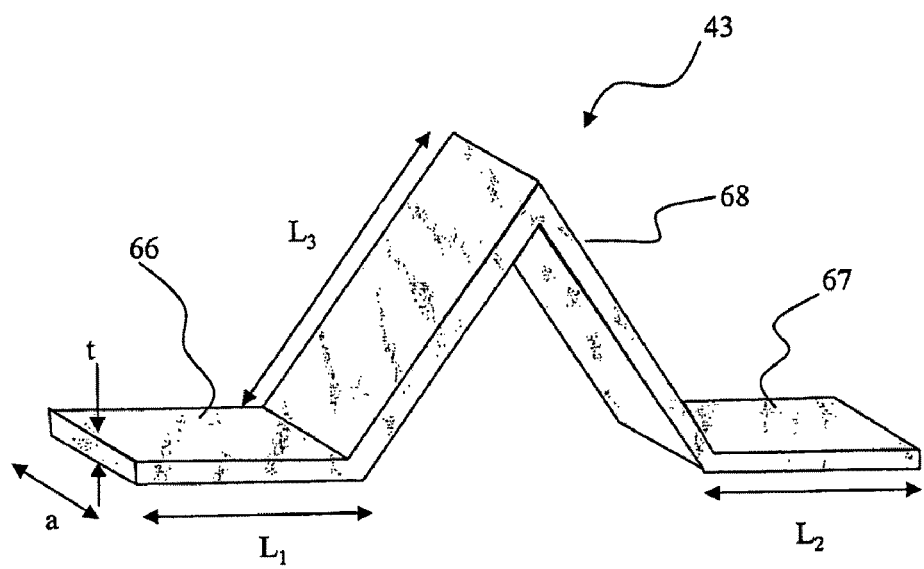
FIG. 11 is a mechanical perspective schematic view of a thermal bridge element according to an embodiment of the present invention.

FIG. 11 is a perspective view of the thermal bridge element 43 shown in the embodiment of FIGS. 7-9. The thermal bridge element 43 includes two flat arms 66 and 67 and a central resilient portion 68 having a reversed V-shaped longitudinal cross-section. Thermal bridge element 43 can therefore be thought of as being made of four straight portions, two of them (i.e., arms 66 and 67) being substantially parallel to one another. From Eq. (3), the thermal resistance, $R_{TB}$, of the bridge element depends on the thermal conductivity of the material, on its cross-sectional area, A=t·a, where t is the thickness of the metal sheet, and on the length of the material traversed by the heat flow, i.e., the longitudinal development of the bridge element. The longitudinal development of the bridge element is the sum of the lengths of the two arms, $L_1$ and $L_2$, and of reversed V-shaped portion ($\approx 2L_3$). For a defined material, thermal resistance is inversely proportional to the thickness, t, i.e., to the rigidity of the element (generally expressed by the Young's modulus). On the other hand, the thermal resistance of the bridge element increases linearly with its length (longitudinal development). Therefore, in practice, when resiliency of the element is desired, an optimal preferred cross-sectional area of the thermal bridge element is a compromise between the two requirements. It is further to be noted that with increasing the longitudinal development of the bridge element may lead to an increase of heat dissipation for convection, due to heat exchange by convection between the thermal bridge element and the surrounding air.

The bridge element 43 is attached to the components of the package module on the flat arms 66 and 67 (as shown for instance in FIG. 9). The element 43 is made of a relatively thick metallic sheet (e.g., of thickness, t, of 0.25 mm) manufactured for instance by photo etching (chemical machining on plate).

Figure 12:
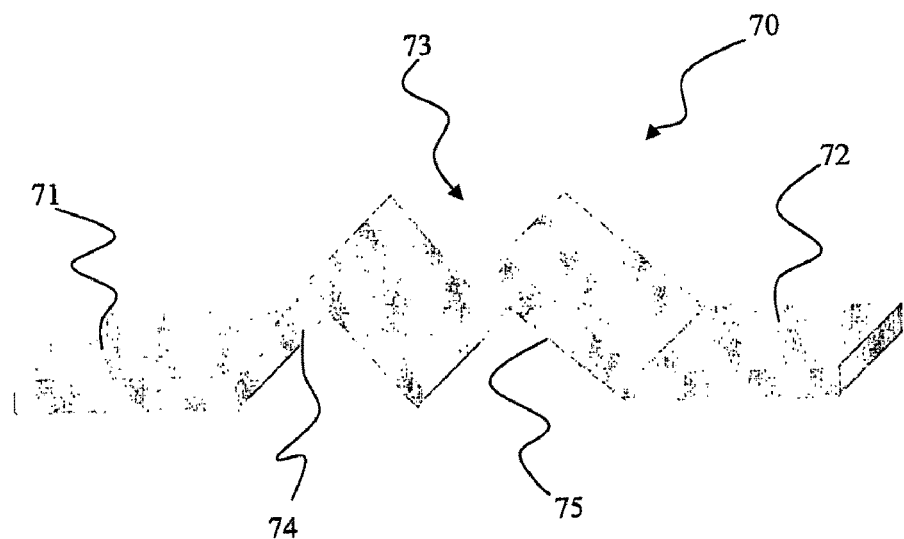
FIG. 12 is a mechanical perspective schematic view of a thermal bridge element according to another embodiment of the present invention.

To improve mechanical flexibility of the thermal bridge element, the central portion of the element can be made for instance of a shape of reversed W, as shown in FIG. 12. The thermal bridge element 70 comprises two straight portions 71 and 72 and a resilient central portion 73 having a reversed W-shaped cross-section, which includes two flexible sub-portions, 74 and 75, each having a reverse V-shape. By increasing the number of the flexible V-shape sub-portions, resiliency of the bridge element increases. However, package constraints can pose an upper limit on the longitudinal development of the bridge element and thus of its longitudinal dimension (i.e., along the X direction), which for instance cannot be larger than 3-4 mm.

An efficient resilient structure of the thermal bridge element with reduced encumbrance and relatively large thermal resistance has been studied with the help of computer simulations by the Applicant.

Figure 13:
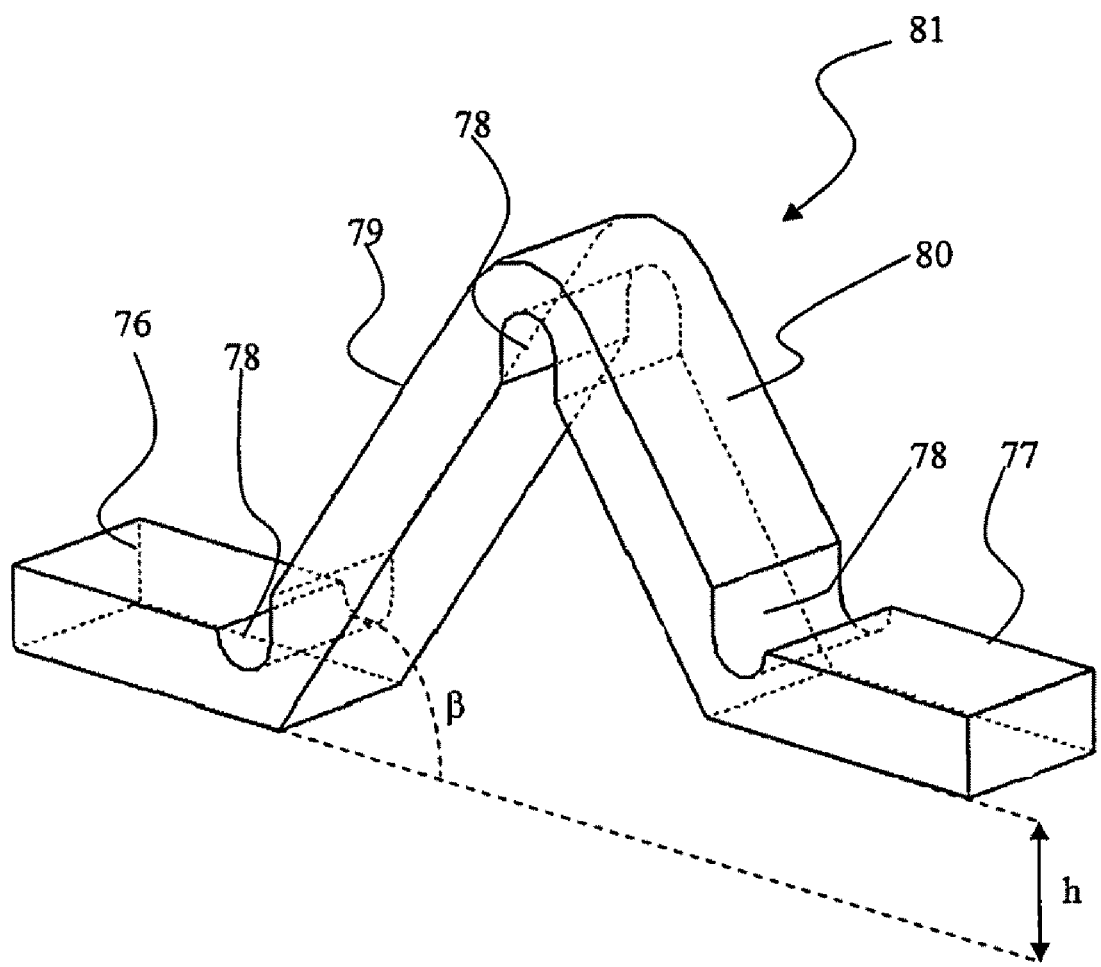
FIG. 13 is a mechanical perspective schematic view of a thermal bridge element according to a further embodiment of the present invention

FIG. 13 shows a perspective view of a preferred embodiment of the thermal bridge element. Thermal bridge element 81 includes four straight portions: a first and a second arm, 76 and 77, respectively, said first and second arms laying on two substantially parallel planes having an offset h along their perpendicular direction, and first and second central portion, 79 and 80, abutted at one edge at a given angle so as to form a reversed V-shaped structure. The offset between the first and second arm is designed in order to take into account the height difference between the position at which the chip is placed (i.e., basically the submount height) and the position of the package. The four straight portions of the thermal bridge element 81 are made of a metallic sheet, wherein the metal is preferably soft copper. In order to improve resiliency of the bridge element, grooves 78 are formed at the hinges between the different straight portions.

Selection of suitable dimensions, shape and material of the thermal bridge element depends on several factors, among which the design of the laser cavity and the thermal resistance between the gain chip and the thermally stabilised TEC surface area (approximately corresponding to the thermally stabilised surface area of the optical bench), $R_{OB}$. By knowing these parameters, variation of the optical path length of the laser cavity due to mechanical deformations of the TEC can be estimated, e.g., by computer simulations, for the operative range of the external cavity laser, i.e., $\Delta\Phi_{FS}(T_{env})$ from Eq. (11) can be estimated for the operative temperature range $\Delta T$. The necessary compensation to the variation $\Delta\Phi_{FS}(T_{env})$ is thus found, either partial or full compensation. A thermal bridge element can be designed to produce the necessary heating/cooling of the gain chip for compensation of the optical path variation.

For example, compensation of the variation of the cavity optical length is found to be achieved by a temperature difference on the gain chip of 0.055° C./° C., i.e., for a variation of +45° C. of the environmental temperature (e.g., from 25 to 70° C.) a heating of 2.5° C. of the gain chip is to be induced. A thermal bridge element of Cu inducing such a temperature gradient on the gain chip placed at $d_1=3$ mm from the TEC exposed surface can have the structure described in FIG. 13 and the following dimensions: the transversal length of the bridge element is of 3.65 mm; first and second arm are 0.87 mm long and 0.50 wide; the offset h is of 0.45 mm; the two central portions form an angle, $\beta$, of 55° with respect to the parallel planes on which the two arms lie, and the metallic sheet making the four portions is 0.25 mm thick. The thermal resistance, $R_{TB}$, is of about 80 K/W.

According to an alternative embodiment, the thermal bridge element is a metallic wire made of a material with high thermal conductivity, such as copper. For example, a Cu wire of 0.25 mm of diameter and 1.5 mm long, having a thermal resistance of about 9 K/W can be used as a thermal bridge element. This relatively low value of $R_{TB}$ can be of the same order as the value of $R_{OB}$ (6-7 W/mK). In order to create a heat flow path from the gain chip to the portion of the package at the environmental temperature through the thermal bridge element corresponding to a higher effective thermal resistance, i.e., at least 1.5 larger than $R_{OB}$, the copper wire is placed at a relatively large distance from the gain chip so that the thermal resistance of the heat flow path from the end of the copper wire to the gain chip is not negligible with respect to the value of R. For instance, a first end of the copper wire is glued by means of Ag-filled epoxy on the bonding pad of a package feed-through and a second end of the copper wire is glued on a vertical wall (vertical with respect to the optical bench) of the submount of the gain chip. For example, the thermal resistance of the heat flow path between the package portion at $T_{env}$ and the gain chip is of about 11 K/W.

Figure 14:
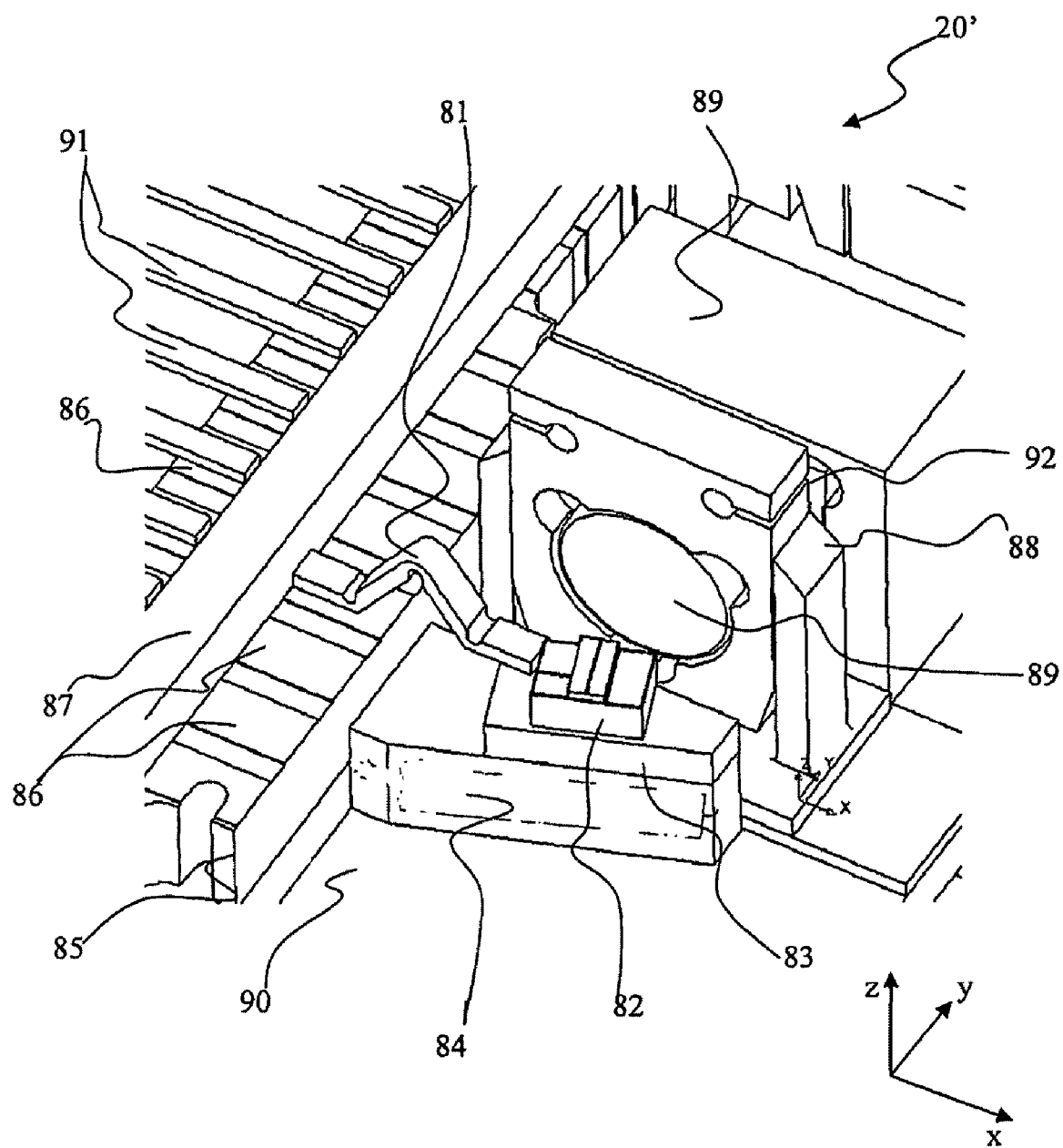
FIG. 14 is a partial perspective view of a laser module according to a further embodiment of the present invention.

FIG. 14 shows a cross-sectional perspective view of a portion of a laser module 20', according to a preferred embodiment of the invention. The thermal bridge element 81 is described more in detail with reference to FIG. 13. The laser cavity comprises a gain chip 82, a collimating lens 89, an etalon and a tuneable mirror. The etalon and the tuneable mirror are not shown in FIG. 14, which shows only the mounting structure 89 housing the etalon. The gain chip 82 is a chip-on-submount (COS) laser sub-assembly, including a semiconductor laser chip mounted of a small thermally conductive submount, e.g., 2×1 mm². The COS laser 82 is mounted on a first thermally conductive submount 83 made for instance of SiC. The first submount 83 is mounted on a second thermally conductive submount 84 made for instance of CuW 80/20 or of AlN. Submount 84 is bonded on a thermally conductive platform 90, which mounts the laser assembly. The thermally conductive platform 90, i.e., the optical bench, is placed on a TEC (not shown). Collimating lens 89 is housed in a mounting structure 88, e.g., a metallic structure such as in Kovar, which is laser welded on the optical bench 90. A mounting structure 88 houses a FP etalon 92 (only a small portion of the etalon is shown in FIG. 14) can be for instance soldered on the optical bed. If the optical bench is of ceramic material, the portion on which the mounting structure 88 and/or 89 is laser welded or soldered is metallised.

The laser assembly of FIG. 14 is housed in a package defining an enclosure comprising lateral walls, a base and at least a feed-through structure. Only a cross-sectional view of a lateral wall 87 and a portion of a feed-trough 85 are illustrated in FIG. 14. The upper surface of the package feed-through 85, i.e., the surface facing the gain chip 82, includes a plurality of bonding pads 86 extending both internally and externally the package enclosure (as for instance in standard ceramic butterfly packages). On the external side of the feed-through, a plurality of leads 91 are soldered on the bonding pads 86.

Thermal bridge element 81 thermally couples the gain chip 82 to the package feed-through 85. The thermal bridge element is soldered on one end to the submount 83 in the proximity of the COS 82 and on the other end to a bonding pad 86. For instance, an end portion of the thermal bridge element is soldered at 1 mm from the edge of the COS 82.

The invention claimed is:

1. An external-cavity laser module comprising:
a package defining an enclosure, said package comprising a base having a surface internal to the enclosure;
a thermoelectric cooler within said enclosure, said thermoelectric cooler comprising an upper carrier plate and a lower carrier plate, said lower carrier plate being in thermal contact with said internal surface of said base and said thermoelectric cooler being configured to stabilise the temperature of the upper carrier plate;
a laser assembly, housed within said enclosure, comprising a gain medium for emitting an optical beam into an external cavity, said gain medium being thermally coupled to the upper carrier plate of the thermoelectric cooler via at least one thermally conductive element so as to provide a first heat flow path having a first thermal resistance; and
a thermal bridge element having first and second arms disposed on opposite ends of an articulated resilient central portion, the first arm placed in thermal contact with the gain medium and the second arm placed in thermal contact with the package, the thermal bridge element providing a second heat flow path having a second thermal resistance between said gain medium and said package,
wherein the second thermal resistance is greater than the first thermal resistance, the second thermal resistance being selected to at least partially compensate for thermally induced variations of an optical path length of the external cavity, so as to maintain a substantially stable laser output power; and
wherein the first thermal resistance is greater than about 5 K/W.

2. The laser module of claim 1, wherein said first thermal resistance is less than about 10 K/W.

3. The laser module of claim 2, wherein said first thermal resistance is between about 5 K/W and 8 K/W.

4. The laser module of claim 1, wherein said thermoelectric cooler comprises a Peltier cell sandwiched between said upper carrier plate and said lower carrier plate of the thermoelectric cooler.

5. The laser module of claim 1, wherein the resilient central portion comprises two straight portions abutted so as to form a V-shape longitudinal cross-section and said two arms are two straight portions substantially parallel to one another.

6. The laser module of claim 5, wherein said thermal bridge element further comprises grooves formed at the hinges between each pair of straight portions.

7. The laser module of claim 1, wherein said enclosure comprises a lateral wall and said package further comprises a feed-through structure providing an electrical interconnect into or out of said lateral wall of said enclosure, and said second end of said thermal bridge element is placed on said feed-through structure.

8. The laser module of claim 1, further comprising a thermally conductive platform in thermal contact with the upper carrier plate of the thermoelectric cooler, said gain medium being placed on said thermally conductive platform.

9. The laser module of claim 8, wherein said laser assembly further comprises an end mirror.

10. The laser module of claim 8, wherein said end mirror is in thermal contact with said thermally conductive platform.

11. The laser module of claim 10, wherein said end mirror is placed on said thermally conductive platform so as to provide a heat flow path to the upper carrier plate of the thermoelectric cooler having a third thermal resistance less than said second thermal resistance.

12. The laser module of claim 11, wherein said third thermal resistance is not greater than 2 K/W.

13. The laser module of claim 8, wherein:
said upper carrier plate of the thermoelectric cooler has a first length along a main longitudinal direction;
said thermally conductive platform has a second length along said main longitudinal direction, said second length being greater than said first length; and
said gain medium is placed on said thermally conductive platform at a given distance along said longitudinal direction from said upper carrier plate.

14. The laser module of claim 13, wherein said distance is not less than 2 mm.

15. The laser module of claim 14, wherein said distance is between 3 and 5 mm.

16. The laser module of claim 8, wherein the thermally conductive platform has a thermal conductivity not less than about 120 W/mK.

17. The laser module of claim 8, further comprising a thermally conductive submount upon which said gain medium is placed, said submount being placed on said thermally conductive platform.

18. The laser module of claim 17, wherein said thermally conductive submount has a thermal conductivity not less than about 120 W/mK.

19. The laser module of claim 1, wherein said gain medium is a semiconductor laser chip.

20. The laser module of claim 1, wherein said laser assembly is configured to emit output radiation and said external cavity defines a plurality of cavity modes, said laser module further comprising:
a grid generator arranged in the external cavity to define a plurality of pass bands substantially aligned with corresponding channels of a selected wavelength grid; and
a tuneable element arranged in the external cavity to tuneably select one of said pass bands so as to select a channel to which to tune the optical beam.

21. The laser module of claim 20, wherein said tuneable element is a tuneable mirror functioning also as end mirror of the external cavity.

22. The laser module of claim 20, wherein the grid generator is arranged in the laser cavity in the optical path of the laser beam emitted by the gain medium between the gain medium and tuneable mirror.

23. The laser module of claim 20, wherein the grid generator is a Fabry-Perot etalon.

24. The laser module of claim 20, further comprising a thermally conductive platform, wherein said gain medium is in thermal contact with said thermally conductive platform.

25. The laser module of claim 24, wherein said grid generator and said tuneable element are in thermal contact with said thermally conductive platform.

26. The laser module of claim 20, wherein the laser assembly is configured to emit output radiation at a laser emission frequency on a single longitudinal mode.

27. The laser module of claim 1, wherein the second thermal resistance is selected to at least partially compensate for thermally-induced variations of an optical path length of the external cavity, so as to maintain a substantially stable laser output power.

28. The laser module of claim 27, wherein the laser output power fluctuates by less than 1 dB.

29. An external-cavity laser module comprising:
a package defining an enclosure, said package comprising a base having a surface internal to the enclosure;
a thermoelectric cooler within said enclosure, said thermoelectric cooler comprising an upper carrier plate and a lower carrier plate, said lower carrier plate being in thermal contact with said internal surface of said base and said thermoelectric cooler being configured to stabilise the temperature of the upper carrier plate;
a laser assembly, housed within said enclosure, comprising a gain medium for emitting an optical beam into an external cavity, said gain medium being thermally coupled to the upper carrier plate of the thermoelectric cooler via at least one thermally conductive element so as to provide a first heat flow path having a first thermal resistance; and
a thermal bridge element having first and second arms disposed on opposite ends of an articulated resilient central portion, the first arm placed in thermal contact with the gain medium and the second arm placed in thermal contact with the package, the thermal bridge element providing a second heat flow path having a second thermal resistance between said gain medium and said package,
wherein said second thermal resistance is greater than said first thermal resistance by a factor of between about 1.5 and about 12; and
wherein the first thermal resistance is greater than about 5 K/W.

30. The laser module of claim 29, wherein said second thermal resistance is greater than said first thermal resistance by a factor of between about 2 and about 12.

31. The laser module of claim 30, wherein said second thermal resistance is greater than said first thermal resistance by a factor between about 5 and 12.

* * * * *